United States Patent

Koetje et al.

[11] Patent Number: 5,991,857
[45] Date of Patent: *Nov. 23, 1999

[54] INTERLEAVING AND DE-INTERLEAVING OF DATA IN TELECOMMUNICATIONS

[75] Inventors: Anno J Koetje, Surrey, United Kingdom; Jukka Ranta, Salo, Finland; Alice Wilson, Berkshire, United Kingdom

[73] Assignee: Nokia Mobile Phones Limited, Espoo, Finland

[ * ] Notice: This patent issued on a continued prosecution application filed under 37 CFR 1.53(d), and is subject to the twenty year patent term provisions of 35 U.S.C. 154(a)(2).

[21] Appl. No.: 08/360,612

[22] Filed: Dec. 21, 1994

[30] Foreign Application Priority Data

Dec. 23, 1993 [GB] United Kingdom ............... 9326234
Oct. 26, 1994 [GB] United Kingdom ............... 9421579

[51] Int. Cl.$^6$ .................................................. G06F 12/02
[52] U.S. Cl. ........................... 711/157; 711/154; 711/159
[58] Field of Search ..................... 371/2.1, 2; 340/347; 395/421.07, 484, 421.08, 427, 428, 438, 431; 711/100, 104, 101, 111, 157, 159, 154

[56] References Cited

U.S. PATENT DOCUMENTS

| | | | |
|---|---|---|---|
| 4,394,642 | 7/1983 | Currie et al. ............................. | 340/347 |
| 4,559,625 | 12/1985 | Berlekamp et al. ....................... | 371/2 |
| 5,042,033 | 8/1991 | Costa ...................................... | 371/2.1 |

FOREIGN PATENT DOCUMENTS

| | | | |
|---|---|---|---|
| 0552979A2 | 1/1993 | European Pat. Off. ....... | H03M 13/22 |
| 0552979 | 7/1993 | European Pat. Off. . | |
| 62-289971 | 12/1987 | Japan ............................. | G11B 120/72 |
| WO 89/01265 | 2/1989 | WIPO . | |

OTHER PUBLICATIONS

WPI Abstract Accession No. 94-113504/14 & JP 6061873 (Sony).
Mar. 4, 1994 and JAPIO Abstract 6061873, 1 page.

*Primary Examiner*—Eddie P. Chan
*Assistant Examiner*—Than V. Nguyen
*Attorney, Agent, or Firm*—Perman & Green, LLP

[57] ABSTRACT

An interleaving process in which data is interleaved or interleaved data is de-interleaved. Input data units are distributed over a plurality of output groups of data units. In GSM telephony, input bits are distributed over nineteen transmission bursts. Incoming data units are written to a contiguous RAM and output groups are read from said RAM. Addressing circuitry controls the writing and reading to the RAM, such that data units are stored until required for an output group. After data has been read, these read locations are re-used for the storage of new input data, such that the duration over which a particular memory location stores a data unit depends upon the interleaving process delay for that particular data unit. The addressing circuitry includes modulo counters, each arranged to generate addressing signals for a respective set of memory locations within the RAM. Look-up tables are used to select modulo counts so as to provide conventional addresses to the RAM. In another embodiment block de-interleaving is performed during the writing of received bits to memory locations. However, said bits are written sequentially to said locations thereby allowing the remaining space to be used for other purposes. In particular, said space may be used for de-interleaving fast associated control channels etc. Bit position de-interleaving is then effected when the data is read from the memory locations or when read from intermediate frame buffer.

30 Claims, 17 Drawing Sheets

$C(2k) = u(k) \oplus u(k-3) \oplus u(k-4)$ ← 41

$G0 = 1 \oplus D^3 \oplus D^4$ ← 45

$C(2k+1) = u(k) \oplus u(k-1) \oplus u(k-3) \oplus u(k-4)$ ← 42

$G1 = 1 \oplus D \oplus D^3 \oplus D^4$ ← 54

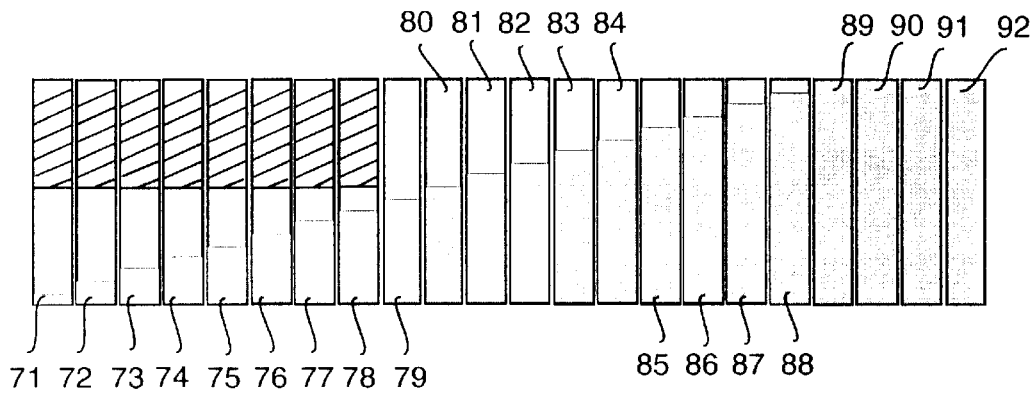
Figure 7
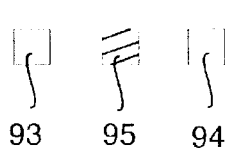
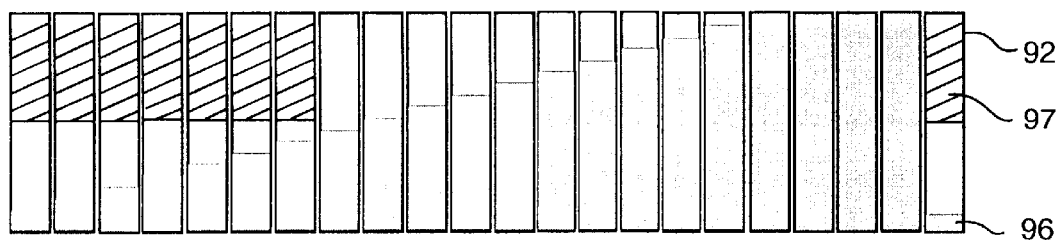
Figure 8
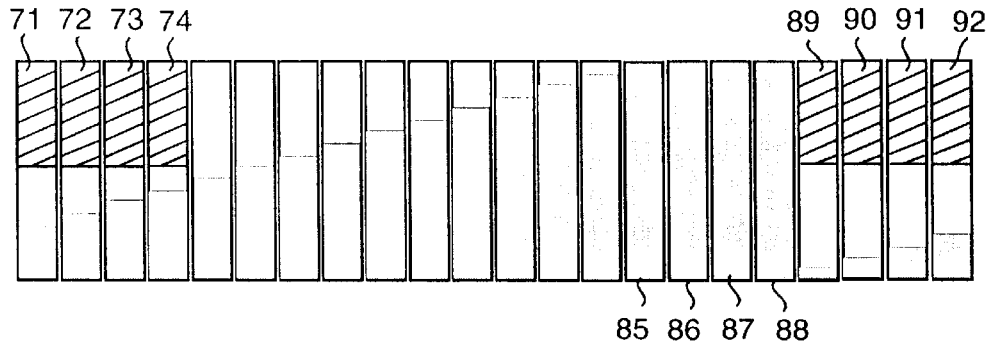
Figure 9

MODCOUNT(0,0) = 0
MODCOUNT(0,1) = 1
MODCOUNT(0,2) = 1
MODCOUNT(0,3) = 1
MODCOUNT(0,4) = 1
MODCOUNT(0,5) = 2
MODCOUNT(0,6) = 2
MODCOUNT(0,7) = 2
MODCOUNT(0,8) = 2
MODCOUNT(0,9) = 3
MODCOUNT(0,10) = 3
MODCOUNT(0,11) = 3
MODCOUNT(0,12) = 3
MODCOUNT(0,13) = 4
MODCOUNT(0,14) = 4
MODCOUNT(0,15) = 4
MODCOUNT(0,16) = 4
MODCOUNT(0,17) = 5
MODCOUNT(0,18) = 5

112

MODCOUNT(1,0) = 0
MODCOUNT(1,1) = 0
MODCOUNT(1,2) = 1
MODCOUNT(1,3) = 1
MODCOUNT(1,4) = 1
MODCOUNT(1,5) = 1
MODCOUNT(1,6) = 2
MODCOUNT(1,7) = 2
MODCOUNT(1,8) = 2
MODCOUNT(1,9) = 2
MODCOUNT(1,10) = 3
MODCOUNT(1,11) = 3
MODCOUNT(1,12) = 3
MODCOUNT(1,13) = 3
MODCOUNT(1,14) = 4
MODCOUNT(1,15) = 4
MODCOUNT(1,16) = 4
MODCOUNT(1,17) = 4
MODCOUNT(1,18) = 5

113

MODCOUNT(2,0) = 0
MODCOUNT(2,1) = 0
MODCOUNT(2,2) = 0
MODCOUNT(2,3) = 1
MODCOUNT(2,4) = 1
MODCOUNT(2,5) = 1
MODCOUNT(2,6) = 1
MODCOUNT(2,7) = 2
MODCOUNT(2,8) = 2
MODCOUNT(2,9) = 2
MODCOUNT(2,10) = 2
MODCOUNT(2,11) = 3
MODCOUNT(2,12) = 3
MODCOUNT(2,13) = 3
MODCOUNT(2,14) = 3
MODCOUNT(2,15) = 4
MODCOUNT(2,16) = 4
MODCOUNT(2,17) = 4
MODCOUNT(2,18) = 4

114

MODCOUNT(3,0) = 0
MODCOUNT(3,1) = 0
MODCOUNT(3,2) = 0
MODCOUNT(3,3) = 0
MODCOUNT(3,4) = 1
MODCOUNT(3,5) = 1
MODCOUNT(3,6) = 1
MODCOUNT(3,7) = 1
MODCOUNT(3,8) = 2
MODCOUNT(3,9) = 2
MODCOUNT(3,10) = 2
MODCOUNT(3,11) = 2
MODCOUNT(3,12) = 3
MODCOUNT(3,13) = 3
MODCOUNT(3,14) = 3
MODCOUNT(3,15) = 3
MODCOUNT(3,16) = 4
MODCOUNT(3,17) = 4
MODCOUNT(3,18) = 4

| 112 | 113 | 114 | 115 |
|---|---|---|---|
| OFFSET(0,0) = 0 | OFFSET(1,0) = 69 | OFFSET(2,0) = 133 | OFFSET(3,0) = 192 |
| OFFSET(0,1) = 1 | OFFSET(1,1) = 70 | OFFSET(2,1) = 134 | OFFSET(3,1) = 193 |
| OFFSET(0,2) = 3 | OFFSET(1,2) = 71 | OFFSET(2,2) = 135 | OFFSET(3,2) = 194 |
| OFFSET(0,3) = 5 | OFFSET(1,3) = 73 | OFFSET(2,3) = 136 | OFFSET(3,3) = 195 |
| OFFSET(0,4) = 7 | OFFSET(1,4) = 75 | OFFSET(2,4) = 138 | OFFSET(3,4) = 196 |
| OFFSET(0,5) = 9 | OFFSET(1,5) = 77 | OFFSET(2,5) = 140 | OFFSET(3,5) = 198 |
| OFFSET(0,6) = 12 | OFFSET(1,6) = 79 | OFFSET(2,6) = 142 | OFFSET(3,6) = 200 |
| OFFSET(0,7) = 15 | OFFSET(1,7) = 82 | OFFSET(2,7) = 144 | OFFSET(3,7) = 202 |
| OFFSET(0,8) = 18 | OFFSET(1,8) = 85 | OFFSET(2,8) = 147 | OFFSET(3,8) = 204 |
| OFFSET(0,9) = 21 | OFFSET(1,9) = 88 | OFFSET(2,9) = 150 | OFFSET(3,9) = 207 |
| OFFSET(0,10) = 25 | OFFSET(1,10) = 91 | OFFSET(2,10) = 153 | OFFSET(3,10) = 210 |
| OFFSET(0,11) = 29 | OFFSET(1,11) = 95 | OFFSET(2,11) = 156 | OFFSET(3,11) = 213 |
| OFFSET(0,12) = 33 | OFFSET(1,12) = 99 | OFFSET(2,12) = 160 | OFFSET(3,12) = 216 |
| OFFSET(0,13) = 37 | OFFSET(1,13) = 103 | OFFSET(2,13) = 164 | OFFSET(3,13) = 220 |
| OFFSET(0,14) = 42 | OFFSET(1,14) = 107 | OFFSET(2,14) = 168 | OFFSET(3,14) = 224 |
| OFFSET(0,15) = 47 | OFFSET(1,15) = 112 | OFFSET(2,15) = 172 | OFFSET(3,15) = 228 |
| OFFSET(0,16) = 52 | OFFSET(1,16) = 117 | OFFSET(2,16) = 177 | OFFSET(3,16) = 232 |
| OFFSET(0,17) = 57 | OFFSET(1,17) = 122 | OFFSET(2,17) = 182 | OFFSET(3,17) = 237 |
| OFFSET(0,18) = 63 | OFFSET(1,18) = 127 | OFFSET(2,18) = 187 | OFFSET(3,18) = 242 |

Figure 15

WRITING TO 22 DEEP INTERLEAVER MEMORY

BUFFER = (DIV-114-COUNT + MOD-19-COUNT) mod 4

ROW = MOD-19-COUNT

BIT = MOD-6-COUNT

READING FROM 22 DEEP INTERLEAVER MEMORY

BUFFER = DIV-114-COUNT

ROW = MOD-19-COUNT

BIT = DIV-19-COUNT

Figure 21

WRITING TO 22 DEEP DE-INTERLEAVER MEMORY

BUFFER = (DIV-114-COUNT + 18 - MOD-19-COUNT) mod 4

ROW = 18 - MOD-19-COUNT

BIT = DIV-19-COUNT

READING FROM 22 DEEP DE-INTERLEAVER MEMORY

BUFFER = DIV-114-COUNT

ROW = 18 - MOD-19-COUNT

BIT = MOD-6-COUNT

Figure 22

INTERLEAVING AND DE-INTERLEAVING OF DATA IN TELECOMMUNICATIONS

FIELD OF THE INVENTION

The present invention relates to an interleaving process, consisting of the interleaving of data or the de-interleaving of previously interleaved data.

BACKGROUND OF THE INVENTION

Radio transmission is subject to short term amplitude variations when transmitting and receiving antennas are not within direct sight of each other. In this situation, the received signal is the sum of a number of reflected copies of the transmitted signal, each having a different phase. The sum of such randomly phased-shifted signals may vary with time, due to movement of reflecting objects or movement of the transmitting and/or receiving antennas. The resulting amplitude variations are known as Rayleigh fading.

A further source of interference, particularly in a cellular radio telephony network, results from a large number of users operating on a small number of frequencies which are re-used in different geographical areas known as cells. When a large number of users of such a network are operating simultaneously, it is possible for interference to result from calls made on the same frequency in another cell. Interference with radio transmissions may additionally be caused by atmospheric conditions and random electro-magnetic interference caused by certain types of electrical equipment.

When transmitting data using a radio communication link, it is necessary to provide a degree of immunity to such interference, so that for an expected level of interference, errors in data transmission may be correctable at the receiver without undue interruption of data communication.

Data coding consists of adding redundant information to source data in such a way that errors in a received encoded data stream may be identified and corrected. The degree of redundancy that is added determines the number of errors in the received signal that may be corrected, before an uncorrectable level of data interference occurs. Typical coding techniques identify and correct individual bit errors in data streams, however, these techniques do not provide resistance to errors that occur in bursts. In order to overcome this difficulty the coded data may be interleaved, such that consecutive data bits are spread out in time and interleaved with other data bits that have been delayed from previous parts of the same data signal.

Thus a continuous burst error imposed upon this type of interleaved data signal does not affect contiguous bits from the original data stream, and after de-interleaving the received coded data will have bit errors that are spread out over time and which are correctable using the redundant data that was added at the data coding stage.

Interleaving may be performed to a depth according to the needs of the data signal being sent. Thus data signals that can tolerate an occasional bit error may be interleaved over shorter periods of time than data signals that have a lower error tolerance. Generally, in a digital radio telephony network, speech signals transmitted as data can tolerate occasional losses, whereas data transmitted from a computer over the same radio link, which may be used to convey important information, such as financial data, etc., should be transmitted with the fewest number of possible errors.

In the case of data being transmitted over a radio telephony network from a computer, a greater depth of interleaving may be used. A greater depth of interleaving implies a longer delay time for certain parts of the original data signal before it is actually transmitted. The delayed data must be stored in a memory or buffer, and the amount of memory used for the process of data interleaving may be great enough to significantly affect the price and power consumption of the equipment in which the interleaving process is to take place. This constraint is particularly applicable to mobile battery powered systems, such as hand-held GSM (Global system for module communication) telephones.

In known systems, interleaving and de-interleaving are achieved by providing a sufficient data memory to store any data bit over the maximum length of time imposed by the interleaving process. However this is wasteful, as the data supplied to the interleaving process is delayed by different times according to its eventual position in the interleaved bit stream output which is eventually transmitted. Thus known systems for interleaving and de-interleaving do not provide the full degree of efficiency that is theoretically implied by the variable timing characteristic of the interleaving or de-interleaving process.

SUMMARY OF THE INVENTION

It is an object of the present invention to provide an improved method and an improved apparatus for performing an interleaving process, consisting of the interleaving of data or the de-interleaving of previously interleaved data.

According to a first aspect of the present invention, there is provided a method of performing an interleaving process, in which input data units are distributed over a plurality of output groups of data units comprising steps of: writing input data units to storage means under the control of addressing means; and reading output groups of said data units from said storage means under the control of said addressing means; wherein said addressing means control said writing and reading such that data units are stored until required for an output group, whereafter read storage locations are re-used for the storage of new input data, such that the duration over which a particular memory location stores a data unit depends upon the interleaving process delay for that particular data unit.

Preferably, a first set of memory locations are read after a first predetermined delay and a second set of memory locations are read after a second predetermined delay. In a preferred embodiment, for transmitting machine-readable data in accordance with the GSM recommendation, a third set of memory locations are read after a third predetermined delay, a fourth set of memory locations are read after a fourth predetermined delay, a fifth set of memory locations are read after a fifth predetermined delay and a sixth set of memory locations are read after a sixth predetermined delay.

According to a second aspect of the present invention, there is provided a method of performing an interleaving process, wherein data is interleaved for radio transmission or interleaved data is de-interleaved after radio transmission, comprising steps of partially performing said interleaving process during the writing of data to a storage means; and completing said interleaving process during the reading of said partially interleaved data from a storage means.

In a preferred embodiment, the data is written to a particular block of storage locations determined by the interleaving process. Thereafter, a plurality of data units may be read from one of said blocks to produce an output burst of data.

In a preferred embodiment, data is stored as multi-bit words, each consecutive bit is written to a different word and to a different location within said word, to effect a first stage of bit interleaving. Thereafter, a second stage of bit interleaving may be effected when said words are read. Preferably, each of said words contains a number of bits equivalent to the number of bit contributions made to each output burst received from a particular input burst.

BRIEF DESCRIPTION OF THE DRAWINGS

FIG. 7 FIGS. 7, 8 and 9 illustrate the storing of data during a de-interleaving process of the type identified in FIG. 2;

FIG. 14 shows a first lookup table for facilitating the optimised interleaving process defined in FIGS. 12 and 13;

FIG. 15 shows a second lookup table for facilitating the optimised interleaving process shown in FIGS. 12 and 13;

FIG. 21 details mathematical operations performed by the control logic unit shown in FIG. 20 when performing the interleaving operations shown in FIGS. 18 and 19; and FIG. 22 details mathematical operations performed by the control logic unit shown in FIG. 20 when performing de-interleaving operations.

DETAILED DESCRIPTION OF PREFERRED EMBODIMENTS

Figure 1:
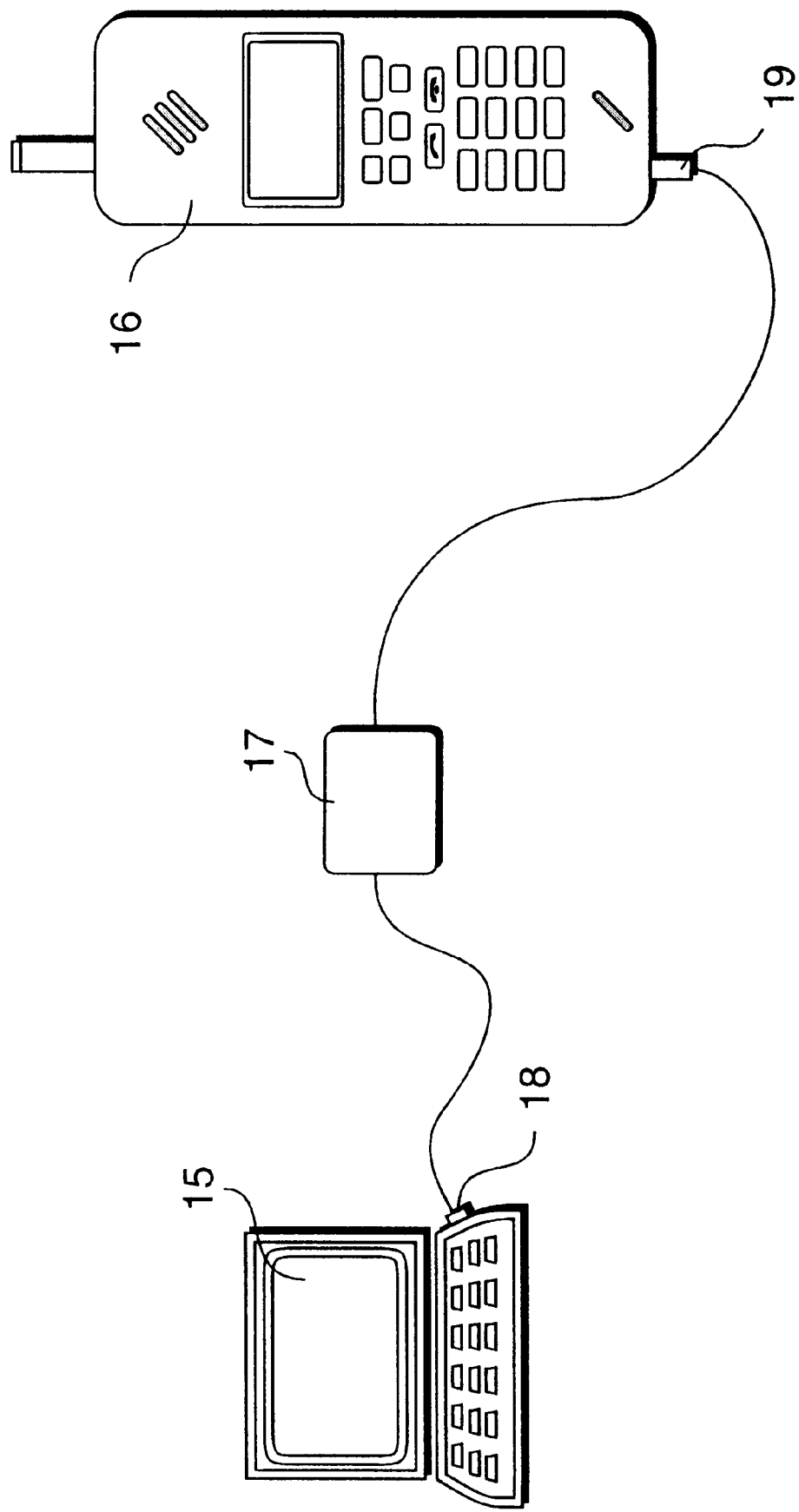
FIG. 1 shows a laptop personal computer arranged to send data over a mobile radio telephone link, including a GSM cellular phone.

A data communications system is shown in FIG. 1, in which a laptop personal computer 15 is connected to a GSM mobile cellular mobile phone 16 via an interface 17. The connection to the laptop personal computer 15 is made via a conventional serial port. The interface 17 provides connections in a form suitable for direct connection to a data port 19 of the cellular telephone 16. Using this arrangement it is possible to provide two-way data communication between the laptop personal computer 15 and another computer, possibly an office-based computer connected via a modem or similar arrangement to a public switched telephone network.

Figure 2:
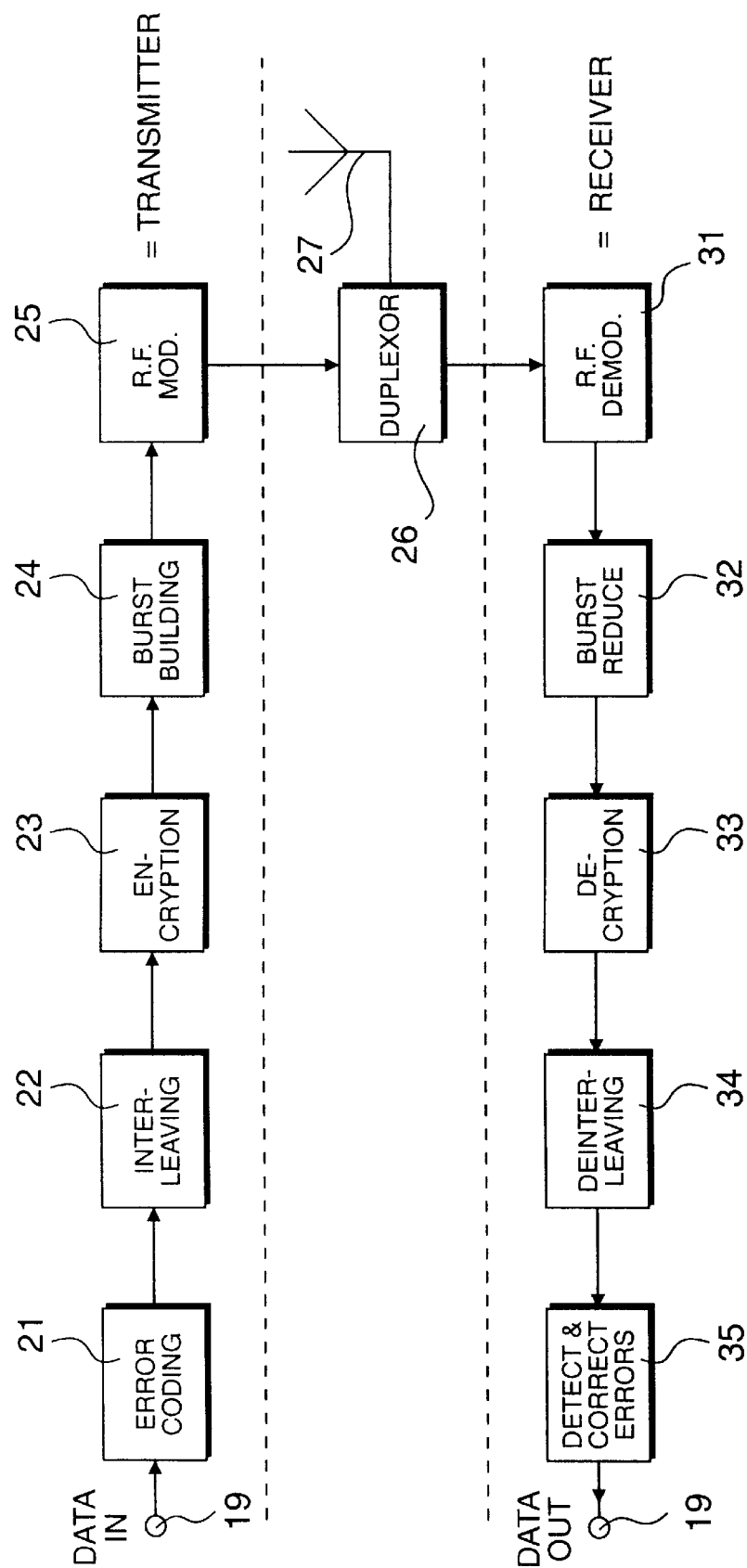
FIG. 2 details processes operating inside the GSM cellular phone shown in FIG. 1 while transmitting data, including an error coding process and an interleaving process.

Operations performed in the cellular telephone 15 shown in FIG. 1 for facilitating two-way data communication are detailed in FIG. 2. Data supplied to the data port 19 of the cellular telephone 16 is supplied to an error coding process 21. The error coding process introduces additional redundant data bits into the data stream which may be used in a receiver to detect and correct errors resulting from radio interference.

The output from the error coding process 21 is supplied to an interleaving process 22, which interleaves the data across time such that burst errors typical of those encountered in radio communications are translated into dispersed single bit errors after de-interleaving in a receiver, which may then be corrected by suitable error detection software and circuitry. The output from the interleaving processor 22 is supplied to an encryption process 23. The encryption process 23 performs a bit-by-bit exclusive-OR operation with a pseudo-random cipher bit stream, such that it is impossible for an unauthorized listener to tune in and decrypt phone calls made using the cellular telephone without access to the cipher.

The output from the encryption process 23 is supplied to a burst building process 24, which translates the stream of bits supplied to its input into bursts of a high bit rate and short duration. The purpose of the burst building process 24 is to reduce the time during which the cellular telephone is transmitting. Periods during which transmission does not occur provide time for reception by the receiving circuitry, and communication by other cellular phones in a dynamic time-sharing arrangement. The time-sharing and frequency hopping characteristics used are described in TS GSM 05.02 of The GSM Specifications.

The output of the burst building process 24 is supplied to a radio frequency modulator 25 that modulates a radio frequency carrier wave at a frequency suitable for cellular telephone traffic. The output from the RF modulation process 25 is supplied to the input of a duplexor 26, which performs the function of sharing the antenna 27 between transmission and receiving circuitry.

Reception of data by the cellular telephone is performed using a reverse processes corresponding to those just described for transmission. These are radio frequency demodulation 31, burst reduction 32, in which short bursts of high bit data are reduced to a stream of lower bit rate data. Decryption 33 in which a cypher stream identical to the one used to encrypt data at a transmitter is again exclusive-ORed with the received bit stream; the result of having passed data through the same exclusive-OR process twice is to re-create the original non-encrypted data.

The output of the decryption process 33 is supplied to a de-interleaving process 34 that re-orders the received bits into the order in which they were originally supplied to the interleaving process 22. The output from the de-interleaving process 34 is supplied to an error detection and correction process 35. Provided that the number of errors does not go above a mathematically defined threshold, all errors may be corrected. The error detection and correction process may include reference to a "confidence" measurement for each bit, generated by the radio frequency demodulation process 31, which is used to aid selection of a corrupt bit from a number of candidate corrupt bits identified during the error detection and correction process. This combination of logical error detection and confidence measurement, followed by error correction, provides a strong immunity to errors.

The output from the error detection and correction process 35 is supplied to the data port 19 of the cellular telephone 19, which communicates received data to the computer 15.

Operations performed for the transmission of data at a rate of 9.6 kbit/s will now be considered in detail. The error coding process 21 shown in FIG. 2 is detailed in FIG. 3. Computer data supplied to the error coding process 21 is divided into separate frames each having 240 bits. A two hundred and forty bit data frame 37 is supplied to a tailing process 38, which adds four bits to the end of the two hundred and forty bit frame. Thus a larger frame 39 of two hundred and forty four bits is generated.

The process of tailing may be described mathematically: the 240 input data bits, labelled d(0) to d(239) are supplied as 240 output bits labelled u(0) to u(240). The final 4 bits in the output series, u(240) to u(243) are set at 0, as these are the tailing bits. The 244 bit data frame 303, containing bits u(0) to u(243), is supplied to a punctured convolutional encoder 40.

A punctured convolutional coder may be considered as having two processes: convolution and puncturing. In practice these processes will usually be performed simultaneously. The convolutional encoding process receives bits u(0) to u(243) from the tailing process 38. Two similar convolutional processes 41 and 42 operate in parallel to generate a bit stream having twice as many bits as the input bit stream. The outputs from the two convolutional processes 41 and 42 are selected alternately for each bit that is supplied to the convolutional encoder, such that the even output bits C(0), C(2), . . . ,C(486) are supplied by the first convolutional encoding process 305 and the odd output bits C(1), C(3), . . . ,C(487) are supplied by the second convolutional process 306. By increasing the number of bits used to represent data in this way, a corresponding convolutional decoder in the error detection and correction process may identify and correct a number of dispersed bit errors.

The bit rate doubling resulting from the convolution process results in a data frame having 488 bits. Widely dispersed occasional bit errors are correctable as a result of the convolutional encoding. Thus a number of bits may be removed from the 488 bits, without significantly affecting the performance of the error detection and correction mechanism. Thirty two bits are removed from the 488 encoded bits, which are selected according to a statistical rule, such that the bits which are removed will have the least impact on the efficiency of the error detection and correction mechanism. Removing bits from a convolutionally encoded data stream in this way is known as "puncturing". The puncturing process is illustrated mathematically as 43 in FIG. 3. Thus the punctured convolutional encoder 40 receives data input frames u(0) to u(243) of 244 bits 39 and converts these into output data frames 44 having 456 bits c(0) to c(455).

Figure 3:
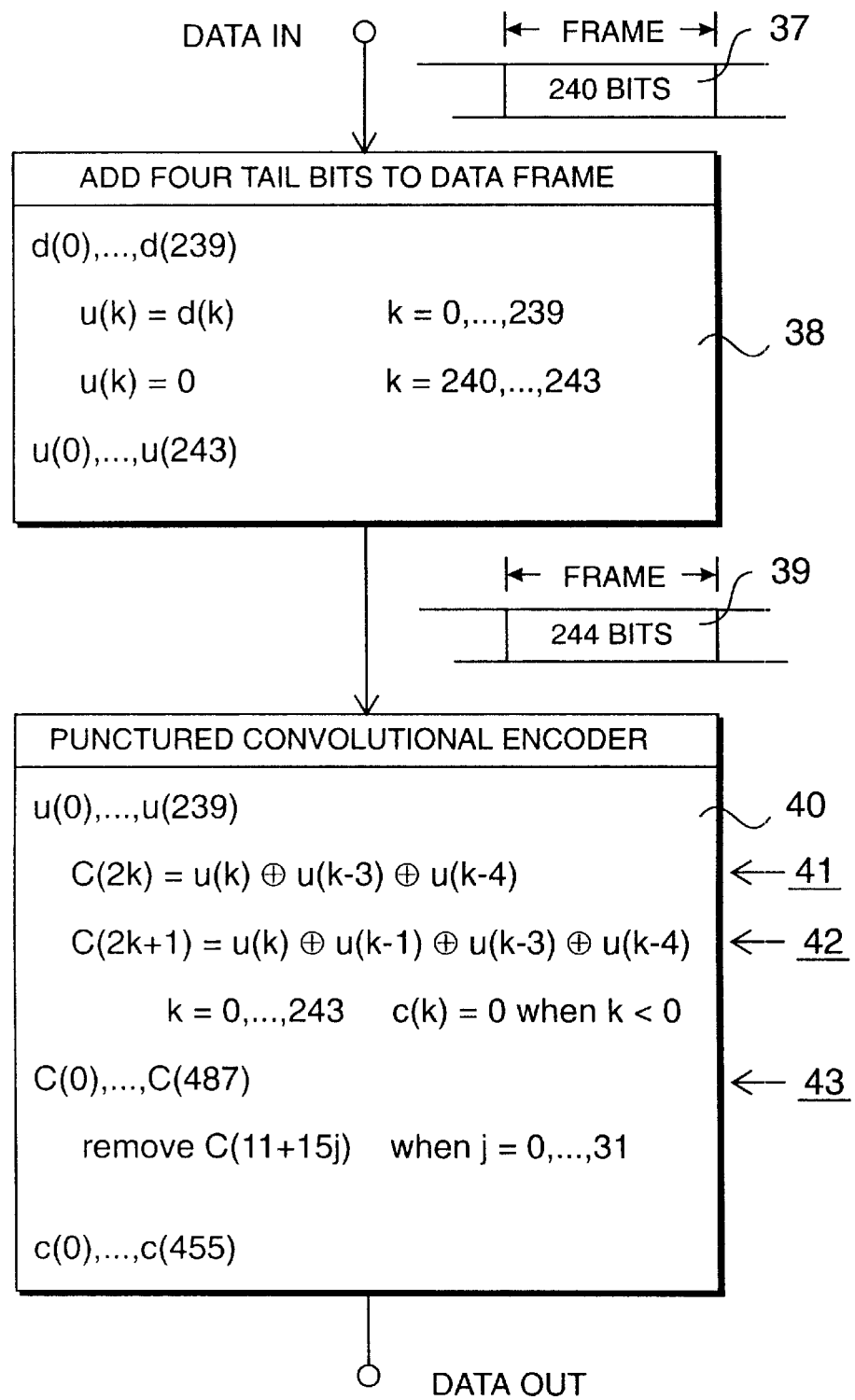
FIG. 3 details procedures for implementing the error coding process shown in FIG. 2, including a first convolution process and a second convolution process.
Figure 4:
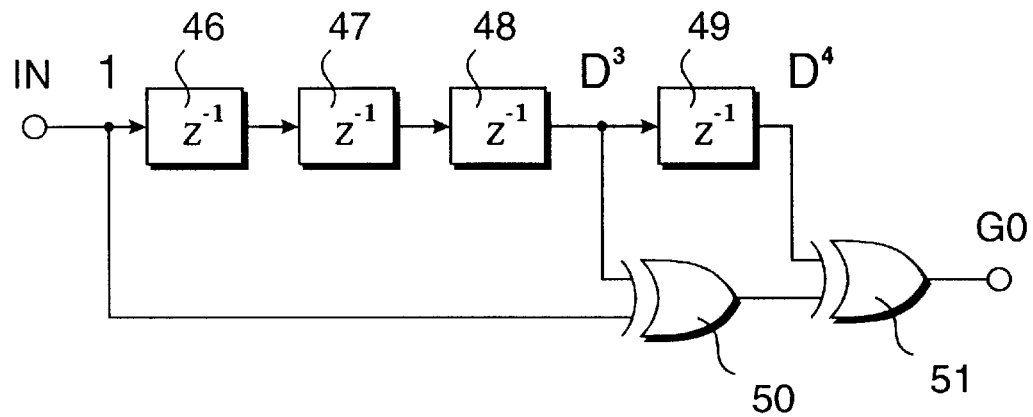
FIG. 4 details a circuit for implementing the first convolution process shown in FIG. 3.

The first convolutional encoding process 41 shown in FIG. 3 is detailed in FIG. 4. The convolution equation 41 shown in FIG. 3 may also be written in a form 45, often used when describing a process of this type. The circuit used to implement this operation consists of four individual bit delays (flip-flops) 46, 47, 48 and 49, and two exclusive-OR gates 50 and 51. The exclusive-OR operation may be thought of as a binary addition between two bits where the carry operation is not performed.

The circuit in FIG. 4 shows an input bit delayed by up to four input bit time periods by the bit delays 46 to 49, so that the current input bit is added to a bit which has been supplied to the input of the circuit three bit periods earlier, and this result is also added to the bit which was supplied four bit periods earlier. The output from the final exclusive-OR gate 51 provides the output from this convolutional process.

In the present application discrete data frames of 244 bits are used, which must not interfere with each other. Thus, the four tail bits added to the original 240 bit frame 301 are used to clear the contents of the single bit delays 46 to 49 progressively at the end of each 244 bit frame supplied to the punctured convolutional encoder 304.

Figure 5:
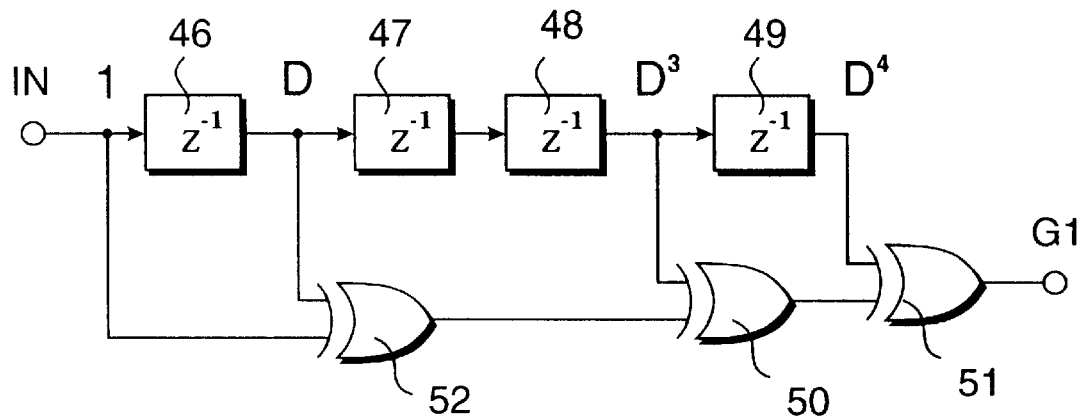
FIG. 5 details a circuit for implementing the second convolution process shown in FIG. 3.

The second convolutional encoding process 42 is detailed in FIG. 5. The convolutional equation 42 may also be written in the form 54. The circuit shown in FIG. 5 operates in a similar way to that shown in FIG. 4, having an additional exclusive-OR gate to add a single delayed bit. In practice the four bit delays 46 to 49 and the exclusive-OR gates shown in FIG. 4 may also be used for the circuit shown in FIG. 5, with the addition of an OR gate 52. The output from the convolutional encoding process shown in FIG. 4 is labelled G0, and this is alternated with the output from the convolutional process shown in FIG. 5, which is labelled G1. Thus 488 bits are generated by alternating data outputs G0 and G1 for each input data bit to the punctured convolutional encoder 304.

Figure 6:
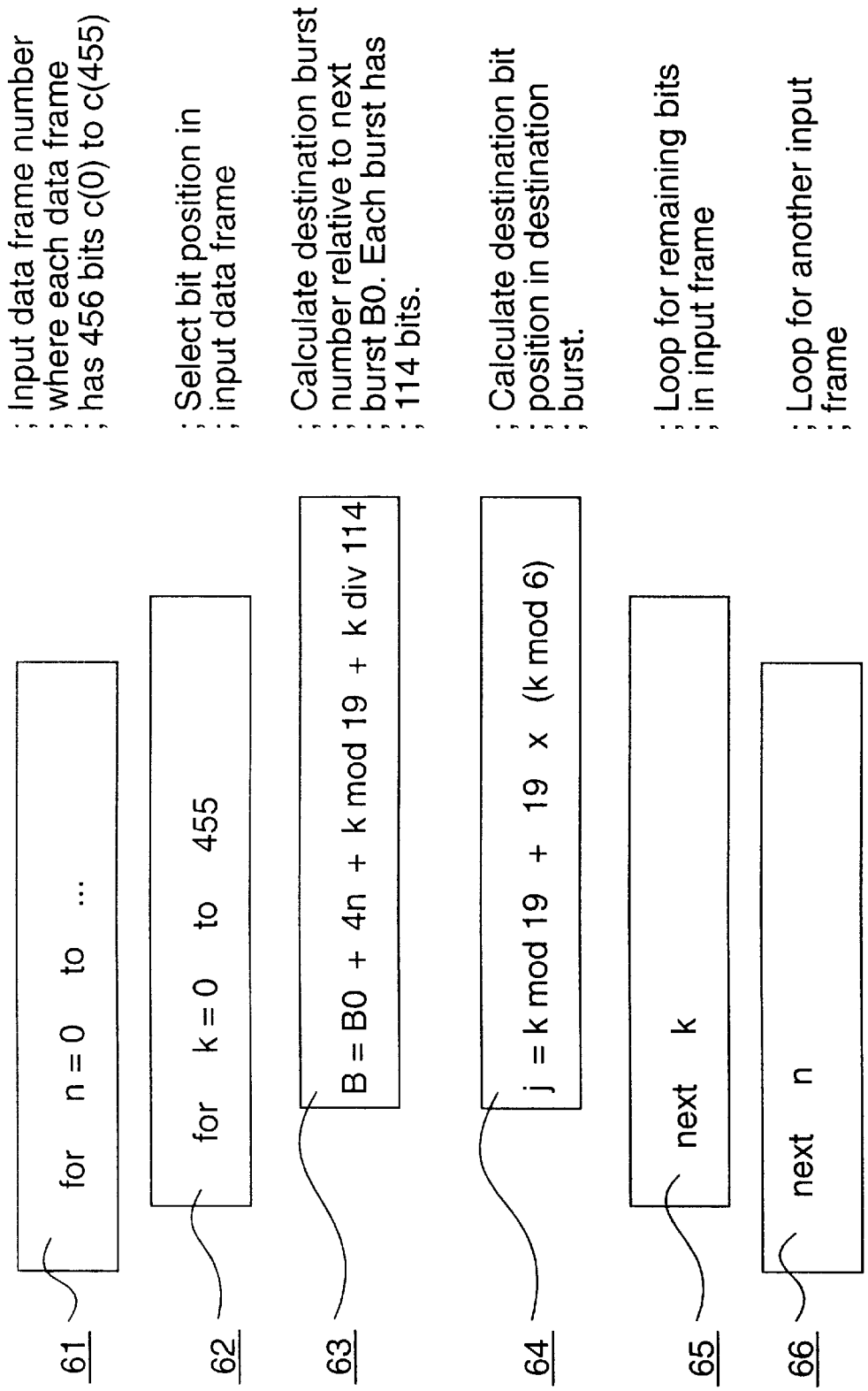
FIG. 6 details a procedure defining a data interleaving scheme of the type shown in FIG. 2.

The interleaving process 22 shown in FIG. 2 is detailed in FIG. 6. This algorithm is defined in TS GSM 05.03.03 of the GSM Specifications as the type of interleaving which is used for a data channel at the full data rate of 9.6 Kb/s. The procedure shown in FIG. 6 receives input data frames containing 456 bits from the error coding process 201. Each 456 bit input data frame may be considered as consisting of four 114 bit sub-frames. Each 114 bit sub-frame is interleaved across the next nineteen transmitted bursts, where each transmitted burst contains 114 bits. The interleaving process may also be considered as the interleaving of each complete 456 bit input data frame over the next twenty-two output bursts.

Line 61 in FIG. 6 defines a loop for counting data frames, and each input data frame consists of 456 data bits c(0) to c(455), generated from data supplied by the lap-top personal computer 15. Line 62 defines a loop for selecting a bit position in the current data frame, in the range 0 to 455. Line 63 calculates the destination burst number B. Each destination burst contains 114 bits which is a quarter of the length of each input data frame. Thus the expression "4n" is used to provide an offset in the output burst number B, equal to four times the index n of the current input data frame.

The expression "k div 114" adds an offset to the burst number such that the second group of 114 bits in the input data frame, c(114) to c(227), will be interleaved across nineteen bursts beginning with burst number "B+1". Similarly the expression "k div 114" ensures that the bits c(228) to c(341) in the input data frame are interleaved across nineteen bursts beginning with burst "B+2". The remaining bits c(342) to c(455) are interleaved across nineteen bursts beginning with burst "B+3". Thus it can be seen how the interleaving of input sub-blocks of 114 bits across nineteen output bursts may also be considered as the interleaving of each 456 bit input data frame across twenty-two output bursts.

The expression "k mod 19" in line 63 selects consecutive destination output bursts for each consecutive input bit. This results in a wide spread of consecutive bits over nineteen bursts, and is thus responsible for defining the major part of the interleaving process of bits across bursts.

The position of a bit in the output burst defined in line 63 is defined in line 64. The value j may take any of the values 0 to 113. The two expressions "k mod 19" and "19 * (k mod 6)" ensure that consecutive bits in the input data frame are widely dispersed across different bit positions in output bursts. The combination of the expressions in lines 63 and 64 results in a complex implementation of the type of interleaving known as diagonal interleaving. Thus, interleaving takes place over sub frame blocks of data and across bit positions within these blocks.

Line 65 defines the end of the loop which starts at line 62 and line 66 defines the end of the loop which begins at line 61. The loop ensures that the operations in lines 63 and 64 are performed 456 times for each input data frame. It can be seen from line 63 that subsequent bits from the input data frame are supplied to different output bursts, and thus are delayed by differing time periods.

In known interleaving schemes, sufficient memory is provided to store input bits for the maximum period corresponding to twenty-two output burst periods. The use of memory in this way is inefficient, as all the data for the previous twenty-two bursts must be stored.

Although memory locations may be provided for storing twenty-two complete bursts of 114 bits, in order to effect interleaving or de-interleaving, the efficient use of this memory storage may be improved if redundant areas of memory can be used for other purposes. In conventional interleaving and de-interleaving, given that the interleaving is performed at bit level and burst level, bits are written to memory locations in a very distributed fashion if the complete interleaving or de-interleaving procedure is effected while the data is being written to the memory locations. However, it is possible to partially perform the interleaving process during the writing of data to a storage means and thereafter completing the interleaving process during the reading of partially interleaved data from a storage device. In particular, it is possible to perform the interleaving process at block level while writing the data to storage locations, whereafter bit position interleaving or de-interleaving is effected during the reading of data from storage locations.

An interleaving procedure in which part of the process is effected while writing data to memory locations and thereafter completed while reading data from memory locations will be illustrated with reference to a de-interleaving process. Referring to FIG. 7, each vertical blocks represents a storage capacity required for one complete burst of de-interleaved data. Bursts 89, 90, 91 and 92 are complete bursts of de-interleaved data which, in combination, provide a complete frame of 256 bits. As bits are received, they must be delayed to a greater or lesser extent, therefore twenty-two 114 bit storage areas 71 to 92 are provided. Conventionally, these areas would be written to so as to achieve the full de-interleaving effect, resulting in bits being dispersed throughout the storage locations, with redundant areas being severely fragmented. However, in accordance with the first preferred embodiment, only partial de-interleaving is effected while the bits are being written to the storage areas, resulting in bits being written to the appropriate area but in a sequential interleaved order, rather than being written in a randomly accessibly de-interleaved order. Thus, each data area 71 to 92 is written to contiguously, thereby providing a clearly identifiable divide between storage locations containing valid data and the remainder of the storage area which is not, at that instant, being used for de-interleaving purposes.

In FIG. 7, storage area 71, capable of storing 114 bits, has only received six valid bits. Similarly, area 72 has only received twelve valid bits, area 73 has received eighteen valid bits and so on, with only areas 89, 90, 91 and 92 being completely full. The presence of user-generated data stored within these areas is represented by shaded regions 93, with the remaining blank regions representing memory locations which are effectively free.

The de-interleaving process still requires the same amount of memory space as it would require using conventional techniques. However, the memory locations which are not required on a particular cycle are used to provide buffering for other purposes. In particular, in the preferred embodiment, fast associated control channels are buffered using some of the memory locations which are not required, on that particular cycle, for de-interleaving data. In the embodiment shown, eight blocks of control channels are used, each containing a total of 57 bits. In FIG. 7, these eight blocks of control channels are represented by shaded region 95.

On the next cycle, when the next block of interleaved data is received, block storage areas 71 to 88 will each receive a further six bits of data, thereby resulting in block 88 becoming full. Similarly, area 92 will have been processed by subsequent circuitry, thereby block 92 effectively becomes clear and may be used for the buffering of other data. Thus, on the next cycle, as shown in FIG. 8, six bits 96 received from the next data burst may be written to area 92, in addition to fifty-seven bits 97 of control data.

FIG. 9 shows a memory allocation after a further three data bursts have been received. Memory locations in areas 85, 86, 87 and 88 are now full of partially de-interleaved data, while areas 71, 72, 73, 89, 90, 91 and 92 contain valid control data.

Figure 10:
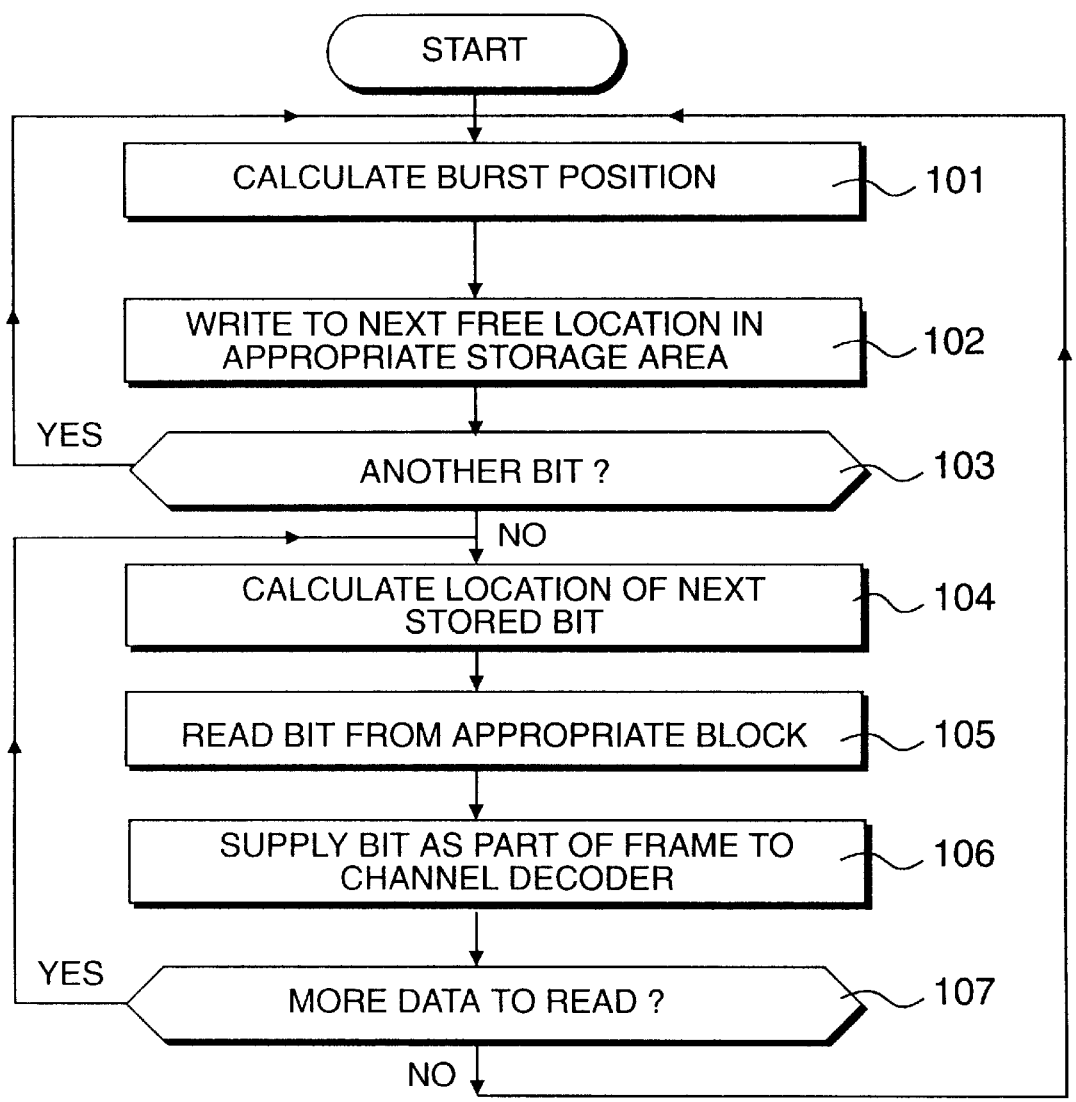
FIG. 10 details the de-interleaving procedure to affect the interleaving in accordance with the procedure identified in FIG. 7, 8 and 9.

A procedure for de-interleaving generated data is detailed in FIG. 10. Incoming interleaved data is considered bit-by-bit, thus step at 101 the burst position of the incoming bit is calculated, resulting in this bit being written to the next location in the appropriate storage area, at step 102. However, when the bit is written to a storage area, it is, not written to a position specified by its de-interleaved bit position, but is written to the next location within the area, that is to say, the lowest numerical position.

At step 103 a question is asked as to whether another bit has been received for a particular burst under consideration and if this question is answered in the affirmative, control is returned to step 101, resulting in the first position being calculated at step 101 and the bit being written to the appropriate area at step 102. Eventually, all the bits for a particular incoming burst will have been written to appropriate storage areas and the question asked at step 103 will be answered in the negative.

When the question asked at step 103 is answered in the negative, all the bits for a received burst will have been written to appropriate area storage locations and the writing of bits is now held up until the next burst is received. The bursts are time multiplexed, therefore a processing facility will have time available to effect the next stage of the de-interleaving process, when bursts relating to other channels are being transmitted. Thus, step 104 initiates a second stage of the de-interleaving process, involving the reading of bits from the storage areas.

At step 104 a memory area full of interleaved bits is read, and thereby effectively fully de-interleaved, by calculating the location of the next bit in the stored area. At step 105, the bit position calculated at step 104 is read, requiring a random access ability on the read side, and this bit is supplied, as part of a de-interleaved frame, to subsequent circuitry.

At step 107 a question is asked as to whether more data is to be read from the storage locations, so as to complete the de-interleaving process. If this question is answered in the affirmative, control is returned to step 94 and the location of the next stored bit is calculated. Eventually, a complete frame of data will have been read from the stored locations and the question asked at step 107 will be answered in the negative. Thereafter, control is returned to step 101, so as to perform partial de-interleaving (at burst level) on the next burst received data.

In an alternative preferred embodiment, data is written sequentially to each of the storage locations identified in FIG. 6. However, the storage locations only provide buffering for the received data and this is accessed on the read side sequentially, in order to sequentially supply the partially de-interleaved bits to a frame buffer. The frame buffer is provided with randomly accessible memory locations which are used for a plurality of functions during the overall operation of the device. Part of the time-shared cycle involves a full frame's worth of memory locations (a total of 456 memory locations) being identified within the frame buffer. Thus, four bursts of partially de-interleaved data are sequentially written to the frame buffer. Thereafter, the de-interleaving process is completed by randomly accessing said frame buffer, so as to provide a frame of data in fully de-interleaved format. However, it should be appreciated that all of the described embodiments involve the technique of effecting partial de-interleaving while writing the data to the memory locations, whereafter the de-interleaving procedure is completed while reading the data from the memory locations. In the particular embodiments, partial de-interleaving is effected to burst level on the write side, whereafter the procedure is completed to bit level on the read side.

Theoretically it is possible to re-use a memory location as soon as its contents have been read for the current output burst. However, in order to achieve this optimum level of memory usage, it would be necessary to provide a memory addressing scheme with significantly more sophistication than the division of writing and reading to buffers at burst and bit level respectively.

In another preferred embodiment, the writing and reading of data, to effect an interleaving process, is performed such that data units are stored until required for an output group. When a data unit has been read, so as to be included as part of an output group, the read storage locations are re-used for the storage of new input data. Consequentially, the duration over which a particular memory location stores a data unit depends upon the interleaving process delay for that particular data unit. Thus, it will be appreciated that the duration over which data is held in the buffer is effectively variable, such that different storage locations are re-used at different rates throughout the overall interleaving or de-interleaving cycle.

Figure 11:
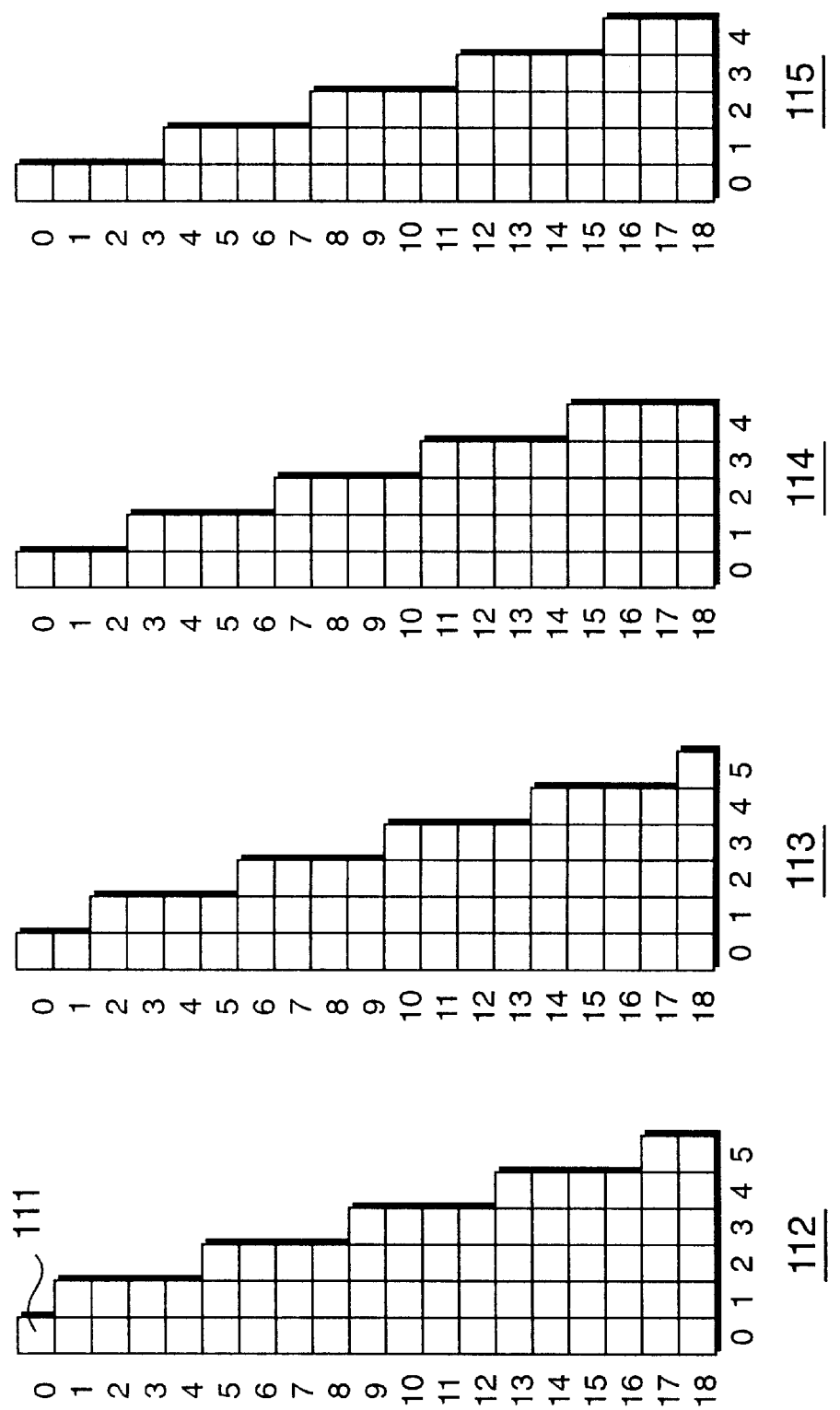
FIG. 11 shows a buffer structure for implementing a memory-optimised interleaving process equivalent to the process shown in FIG. 6.

A memory or buffer structure reflecting the time delays required for bits in an input data frame is shown in FIG. 11. The interleaving procedure shown in FIG. 6 results in an interleaving scheme where each input data frame of 456 bits may contribute 6 bits, 12 bits, 18 bits or 24 bits to an output burst. This is because not all of the 114 bit sub-frames (blocks) in the input data frame will be interleaved over the next burst. The first 114 bits c(0) to c(113) of an input data frame c(0) to c(455) will contribute 6 bits to the next burst "B", six bits to burst "B+1", six bits to burst "B+2" and six bits to burst "B+3", according to the equation on line 603 of FIG. 6. The second 114 bits c(114) to c(227) will contribute no bits to the next burst "B", six bits to burst "B+1", six bits to burst "B+2", and six bits to burst "B+3". Thus from the current data frame of 456 bits, six bits are supplied to the next burst "B", twelve bits to burst "B+1", eighteen bits to "B+2", twenty-four bits to burst "B+3", twenty four bits to burst "B+4" and so on. Thus each output burst contains six, twelve, eighteen or twenty-four bits which have been delayed for an integer number of burst periods since being supplied to the interleaving process as part of a complete data frame. The structure shown in FIGURE 11 is divided into blocks of six bit units, which are shown as squares 111. Buffer 112, contains data which will be used for the next output burst "B". Buffers 113, 114 and 115 contain data which will be used to make up the next three bursts "B+1", "B+2" and "B+3" respectively. In buffer 112, each of the nineteen rows, numbered 0 to 18, contain between one and six squares. Each square represents a six bit contribution made by a current or a previous input data frame.

Six bits of data from the first 114 bits c(0) to c(113) of the current input data frame c(0) to c(455) will be interleaved across the next burst "B", and so require no delay. These six bits will be written to the square at row 0 column 0 of buffer 112. Another six bits from the first 114 bits c(0) to c(113) will be interleaved across burst "B+1", and six bits from the second 114 bits c(114) to c(227) will also be interleaved across burst "B+1". Thus twelve bits supplied to buffer 113 require no delay, and these are stored in the two squares at the top of buffer B in row 0; column 0 and row 1, column 0.

Six bits of data from the first 114 bits c(0) to c(113) will be interleaved across burst "B+2", requiring no delay. Six bits from the second 114 bits c(114) to c(227), and six bits from the third 114 bits c(228) to c(341) will also be interleaved across burst "B+2". Thus eighteen bits supplied to buffer 114 require no delay, and these are represented by the three squares at the top of buffer 114; in row 0, column 0, row 1, column 0 and. row 2, column 0.

Six bits from the first 114 bits c(0) to c(113), six bits from the second 114 bits c(114) to c(227), six bits from the third 114 bits c(228) to c(341) and six bits from the last 114 bits c(342) to c(455) will be interleaved across burst "B+3". Thus twenty-four bits supplied to buffer 115 require no delay, and these are represented by the four squares at the top of buffer 115; in row 0, column 0, row 1, column 0, row 2, column 0 and row 3, column 0.

Thus the parts of the current input data frame which are to be supplied to the next four bursts are written to parts of buffers 112 to 115 which have a width of one square. Bits from the current input data frame which are to be supplied to bursts "B+4", "B+5", "B+6" or "B+7" are written to parts of buffers 112 to 115 which have a width of two squares. Data from the present input frame which is destined for bursts "B+8", "B+9", "B+10" and "B+11" are written to parts of buffers A to D which have a width of three blocks, and so on. Thus the buffer structure shown in FIG. 11 provides delays required for complex interleaving of an input data frame over twenty-two subsequent output bursts.

Buffer 112 and buffer 113 have base widths of six blocks, corresponding to a delay of 5×4 bursts (four bursts because there are four burst buffers 112 to 115). Buffer 114 and buffer 115 have base widths of five squares, corresponding to a delay of 4×4 bursts. Thus buffer 112 contributes to bursts "B" to "B+20". Buffer 113 contributes to bursts "B+1" to "B+21", giving the interleaving depth of 22 output bursts. Buffer 114 contributes data to bursts "B+2" to "B+18" and buffer 115 contributes data to bursts "B+3" to "B+19".

A row in any of the buffers 112 to 115 which contains more than one square operates as a delay line. Considering row five in buffer 112, once a data bit has been written to the square in column one, which is the middle of the three squares, when the next output burst is read from buffer 112, the square in row five that is read from will be the in column two. The next time that row five is written to, the square previously read out in column two will be used. In this way memory is re-used for new data once the delayed data has been transmitted.

Circular counters are used to point to columns, so that after each input data frame has been written to the buffer structure, the circular counters are incremented to point to the next column to be read. Thus the counter for row five may point to column zero, column 1 or column 2, re-setting itself automatically to 0 instead of counting beyond two. This type of counter is known as a modulo-3 counter.

The same modulo-3 counter is used to index the column in rows 6, 7 and 8 of buffer 112. Furthermore the same modulo-3 counter may be used for rows 6 to 9 in buffer 113, rows 7 to 10 in buffer 114 and rows 8 to 11 in buffer 115. The reason that the same counter may be used for all of these different rows and buffers is that a single read-increment-write cycle is performed once for each input data frame that is interleaved.

A modulo-2 counter is used to index rows 1 to 4 in buffer 112, rows 2 to 5 in buffer 113, rows 3 to 6 in buffer 114 and rows 4 to 7 in buffer 115. A modulo-4 counter is used to index rows 9 to 12 in buffer 112, rows 10 to 13 in buffer 113, rows 11 to 14 in buffer 114 and rows 12 to 15 in buffer 115. A modulo-5 counter is used to index rows 13 to 16 in buffer 112, rows 14 to 17 in buffer 113, rows 15 to 18 in buffer 114 and rows 16 to 18 in buffer 115. A modulo-6 counter is used to index rows 17 and 18 in buffer 112 and row 18 in buffer 113.

Figure 12:
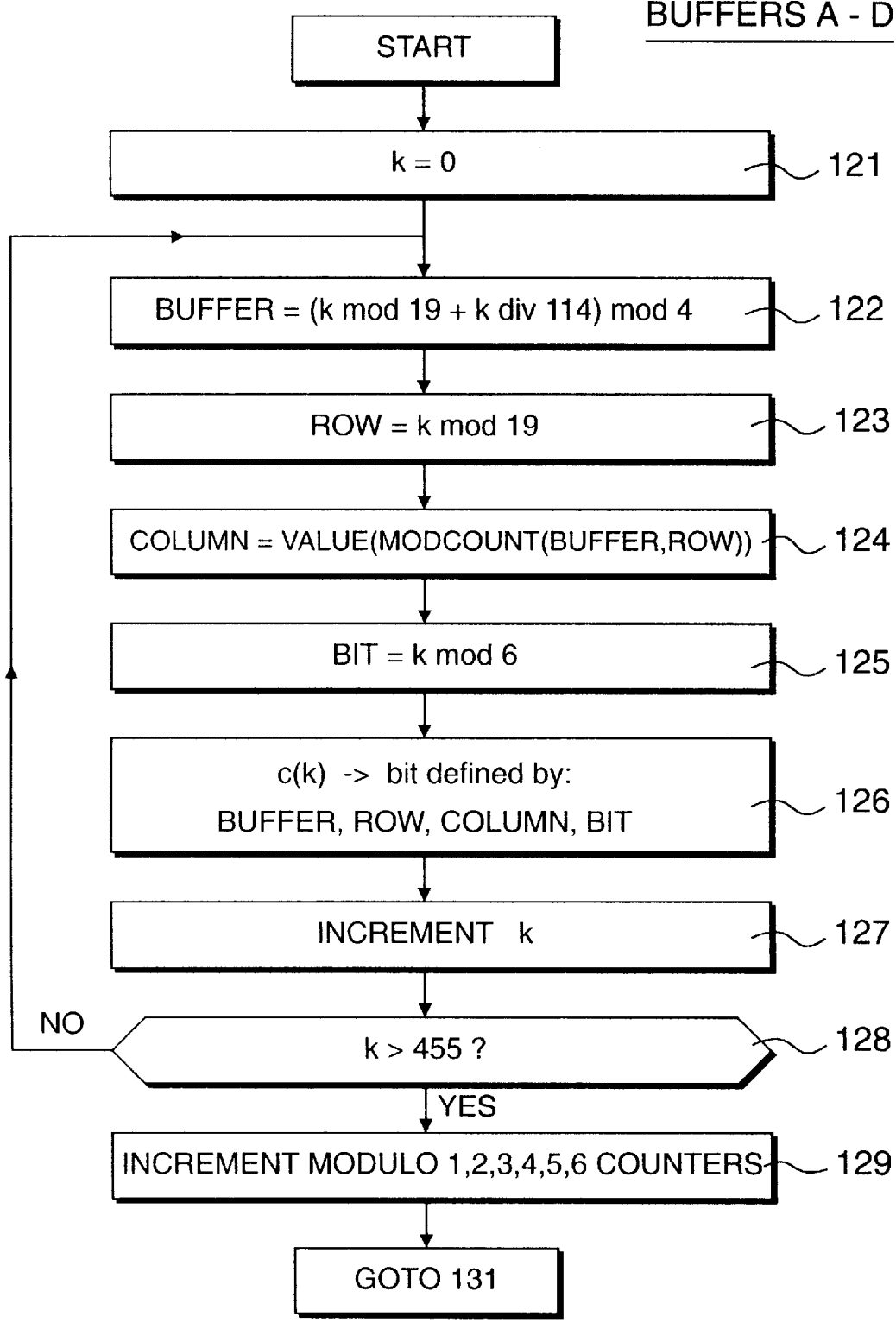
FIG. 12 shows a flow chart for implementing the part of the optimised data interleaving process which writes data bits to the buffer structure shown in FIG. 11.

Operations for writing an input data frame c(0) to c(455) to buffers A to D are detailed in FIG. 12. In process 121 a bit counter k is set to zero. In process 122 the destination buffer is selected by means of a mathematical expression closely related to the one in line 63 in FIG. 6. A value identified by variable "BUFFER" is evaluated to a value of between zero and three, corresponding to buffers 112 to 115.

Process 123 evaluates the destination row of the selected buffer. Consecutive bits in the input data frame c(0) to c(455) are sent to consecutive rows in buffers indexed by the expression "k mod 19". Process 124 calculates the destination column in the selected buffer. The destination column is given by the value of the modulo counter used to index the selected row calculated in process 123. There are six modulo counters, these are modulo-1, modulo-2, modulo-3, modulo-4, modulo-5 and modulo-6 (of these, modulo-1 is not a real counter because its output is always zero).

The actual modulo counter that is used is dependent upon which buffer and which row has been calculated in processes 122 and 123. A look-up table is used so that, for example, row 2 of buffer 113 will use the modulo-2 counter.

The expression in process 124 identifies which modulo counter contains the column index for the current row. Process 125 identifies which of the six bits in the square in the row and column is to be written to using the function "k mod 6". This has the effect of sending each consecutive input bits c(k) to different parts of respective six bit words. This adds a small diagonal offset to the bit interleaving process. Further bit interleaving, where each six bit word is spread evenly across a 114 bit output burst, will be performed when reading from the buffers. Thus, the procedure also makes use of performing part of the interleaving process when writing and the remainder while reading.

Thus in process 806 the next bit c(k) in the input data frame c(0) to c(455) is written to the bit position identified in process 125 at the row and column identified in processes 123 and 124, in the buffer identified in process 122.

In process 127 the bit counter k is incremented. At process 128 the value of k is tested to see if it is greater than 455. If k is less than 455, processes 122 to 127 are repeated. If k is greater than 455 control is diverted to process 129. In process 129, the modulo counters: modulo-2, modulo-3, modulo-4, modulo-5 and modulo-6 are incremented. The modulo-1 counter does not need to be incremented because it always has the value of zero. After process 129 has been completed and all the bits in the current input data frame c(0) to c(455) have been written to the appropriate parts of the buffer structure shown in FIG. 11, it is possible to read out bits from the buffer structure in a different order so that the next four bursts "B", "B+1", "B+2", and "B+3" can be generated.

The procedure for reading four new bursts from the buffer structure is detailed in FIG. 12. In a process 131, the variable "BUFFER" is set to zero thereby corresponding to buffer 112. At a process 132, the bit counter k is also set to zero and at a process 133 the row in the currently selected buffer is evaluated. At a process 134 the column of the next output bit is evaluated. This evaluation is performed in a similar way to that described for process 124 in FIG. 12, in that a look-up table is used to identify a particular modulo counter which is used for a particular row in a particular buffer.

The value of the selected modulo counter defines the column. Process 135 identifies which bit of the six in the square identified by the row and column calculations in processes 133 and 134 is to be read. This is given by the expression "(k div 19) mod 6". This expression selects bit zero nineteen times, bit one nineteen times, bit two nineteen times, bit three nineteen times, bit four nineteen times and bit five nineteen times, with each of the nineteen bits for each bit position being selected from a square in a different row in the current buffer 112 to 115.

For each buffer 112 to 115, there are nineteen squares ready for use as an output burst. The nineteen from buffer 112 being used for burst "B", the nineteen from buffer 113 being used for burst "B+1", and so on. Thus, when generating burst "B", one of the squares in each row of buffer 112 contains six bits for inclusion in burst "B". However these six bits are from the same quarter of the same data input frame and therefore must be spread out over burst "B" in a regular fashion. Six divides into 114 nineteen times, and this explains the bit interleaving defined by the expression "(k div 19) mod 6" in line 135. Bit interleaving is thus performed partially when writing to the buffers, and partially when reading from the buffers.

In process 136 the next burst bit is read from the location defined by variables "BIT", "COLUMN", "ROW" and "BUFFER", which have been calculated previously. In process 137 the bit counter k is incremented, and at process 138 the value of k is investigated to see if it is greater than 113. If k is less than or equal to 113, control is returned to process 133 so that calculations for the next bit in the current output burst may be performed. If k is greater than 113 control is diverted to process 139, where the buffer value is incremented. Thus, with an initial "BUFFER" value of zero, "BUFFER" will be incremented through one two and three, corresponding to buffer 113, buffer 114 and buffer 115 respectively. In process 131 the value of "BUFFER" is tested to see if it is greater than three. If the value of "BUFFER" is less than or equal to three, control is returned to process 132, where calculations for generating the next 114 bits of the next output burst begin. If the value of buffer is greater than three, this indicates that each of the buffers 112 to 115 have been used to generate the next four bursts, and the interleaving for the next four bursts has been completed.

Figure 13:
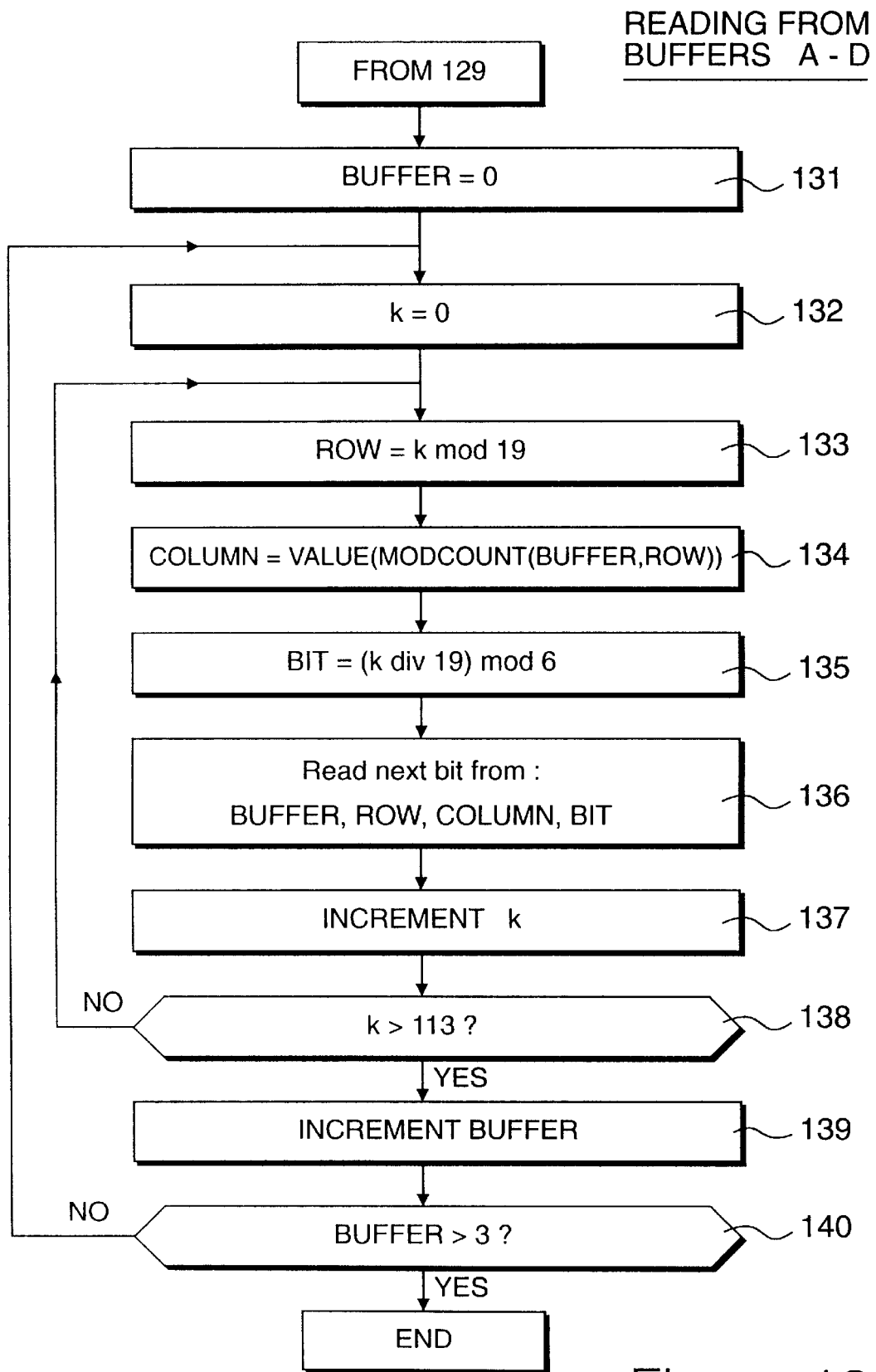
FIG. 13 shows a flow chart for implementing the part of the optimised data interleaving process which reads bits from the buffer structure shown in FIG. 11.

The look-up table used in process 134 in FIG. 13 and process 124 in FIG. 12, is detailed in FIG. 14. The look-up table is a two-dimensional array, with the first dimension indexed by the buffer number, and the second dimension indexed by the row number. By comparing FIG. 14 with the buffer structure shown in FIG. 11, it can be seen how the look-up table has been derived. The value in each location of the look-up table shown in FIG. 14 determines which of the six modulo counters modulo-1, modulo-2, modulo-3, modulo-4, modulo-5 and modulo-6 is used to generate a value for selecting a column. In the look-up table, a value of zero indicates the modulo-1 counter, a value of 1 indicates the modulo-2 counter, a value of 2 indicates the modulo-3 counter, a value of 3 indicates the modulo-4 counter, a value of 4 indicates the modulo-5 counter and a value of 5 indicates the modulo-6 counter.

The buffer structure shown in FIG. 11 is addressed by defining a buffer, a row and a column. Real memory is addressed by a single number, rather than the three which have been used so far. A second look-up table is used to translate buffer and row combinations into address offsets in a standard single dimensional memory, to which may be added the output value of the appropriate modulo counter. A look-up table for translating buffer and row combinations into address offsets is shown in FIG. 15. The offset values may be understood by considering FIG. 15 in conjunction with the buffer structure shown in FIG. 11. The first offset in buffer 112 is zero. The second offset, corresponding to the location for the square at row 1, column zero in buffer 112 has a value of unity. The third offset in buffer 112, corresponding to the address of the location for the square at row two, column zero in buffer 112 has the value three. This structure occurs because one memory location (containing 6 bits) is used for the top square in buffer 112, the next row in buffer 112 contains two squares, and so the offset for the first square in buffer 112, which is 1, must have 2 added to it to give the offset for the first square in the second row. The value of the modulo counter for a row in a particular buffer never increments above a value which would cause its addition to the selected offset value to go beyond or equal to the value of the offset address for the beginning of the next row in that buffer. Thus the look-up table shown in FIG. 15 translates the multi-dimensional buffer structure shown in FIG. 11 into single values that are used to address a standard memory device with a single dimensional address. By using a look-up table for memory offsets, an area of memory may be used for interleaving without any unusable or wasted six-bit locations. After each new group of four output bursts is generated, the memory locations from which the four bursts have been read are immediately re-used for the next input data frame of 456 bits.

Process 126 shown in FIG. 8 requires that a bit in a selected 6 bit word is changed. While it is possible to use memory that has a data bus width of 1 bit, with each bit having a unique memory address, it is preferable to use a data bus width of 6 bits, so that addressing circuitry may be simplified. In order to change a single bit in a multi-bit memory location it is necessary to perform a read-modify-write operation.

Figure 16:
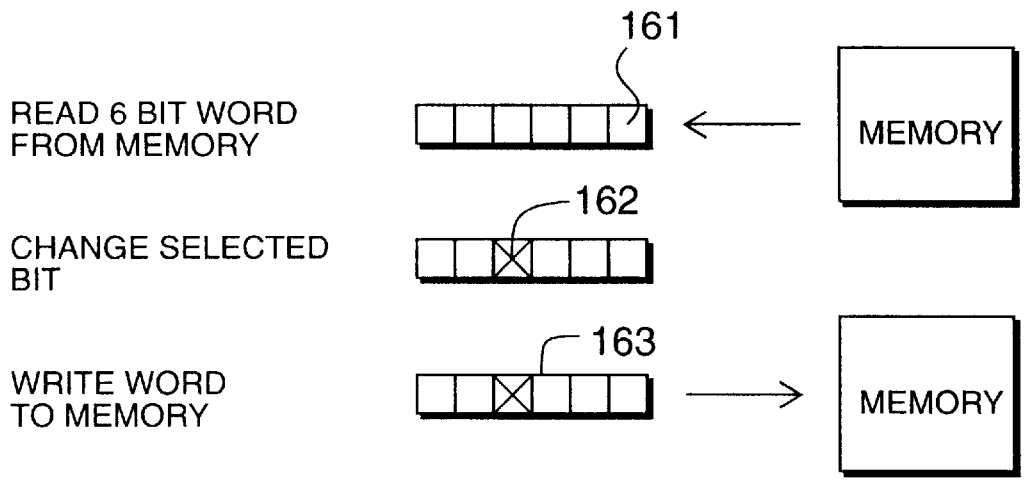
FIG. 16 details a read-modify-write process used in the process shown in FIG. 12.

The procedure for performing a read-modify-write operation of the type identified in process 126 of FIG. 12 is detailed in FIG. 16. There are three stages for the operation. Firstly, a six bit word 161 is read from memory, according to the address defined by values which have previously been calculated for the buffer, row and modulo counter value. A selected bit 162 that is to be written to is then changed to its new value. Finally the modified six bit word 163 is written back to the memory at the address from which it was initially read. The read-modify-write operation provides an advantage in that the address lines to the memory do not change during the operation, so that there is no need to wait for an address line settling time before the final write operation can be performed.

Figure 17:
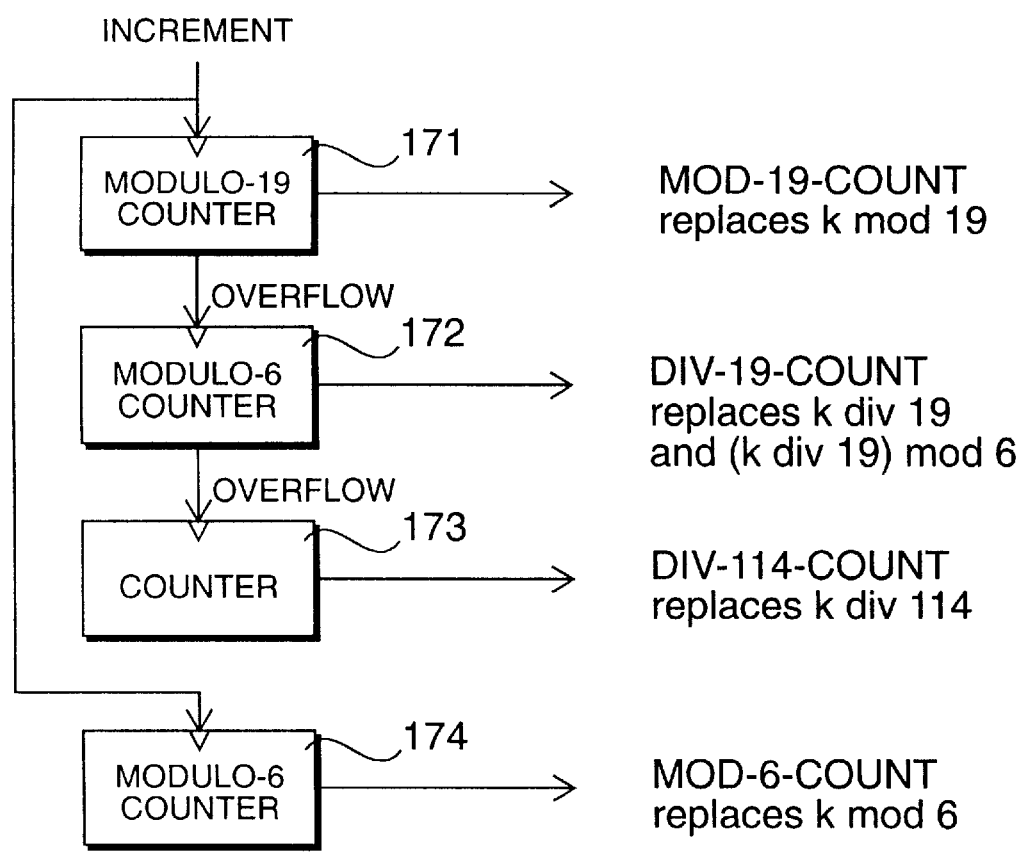
FIG. 17 shows hardware counters for automatically calculating mathematical expressions shown in FIG. 8 and FIG. 13.

Several of the mathematical expressions identified in the procedures shown in FIG. 12 and FIG. 13 may be simplified by using the counter circuits shown in FIG. 17. A modulo-19 counter 171 may be used to replace the value calculated by the expression "k mod 19" which occurs several times in the procedures. The output from the modulo-19 counter 171 is called MOD-19-COUNT.

The overflow from the modulo-19 counter 171 occurs each time the modulo-19 counter changes from a value of eighteen to zero. This overflow is used to clock a modulo-6 counter 172, the output of which may replace the expression "(k div 19) mod 6", which is used at step 135 of FIG. 13. The output from the modulo-6 counter 172 is called "DIV-19-COUNT", indicating that its value is incremented once for every nineteen increments of the modulo-19 counter 171.

The overflow from the modulo-6 counter occurs every time the modulo-6 counter has an output which changes from five to zero, and this overflow is used to clock another counter 173. The output from the counter 173 is called "DIV-114-COUNT", indicating that it increments once for every 114 increments of the modulo-19 counter 171. It is used to replace the expression "k div 114", which occurs in process 122 shown in FIG. 12 and is used to indicate which of the buffers 112 to 115 (indexed by zero to three respectively) is to be used. The output of the counter 173 may also be used to indicate when a writing or reading process has been completed, as it will have been incremented to a value greater than three, which does not correspond to any of the buffers 112 to 115.

Another modulo-6 counter 174 (not the same as the modulo-6 counter which is used to index columns in the buffer structure or the modulo-6 counter 172 used for generating DIV-19-COUNT values) replaces the expression "k mod 6" which occurs at step 125 of FIG. 12. The modulo-6 counter 174 is incremented at the same time as the modulo-19 counter 171, and is not part of the cascaded chain of counters 171, 172 and 173. The output of this modulo-6 counter 174 is called "MOD-6-COUNT".

Figure 18:
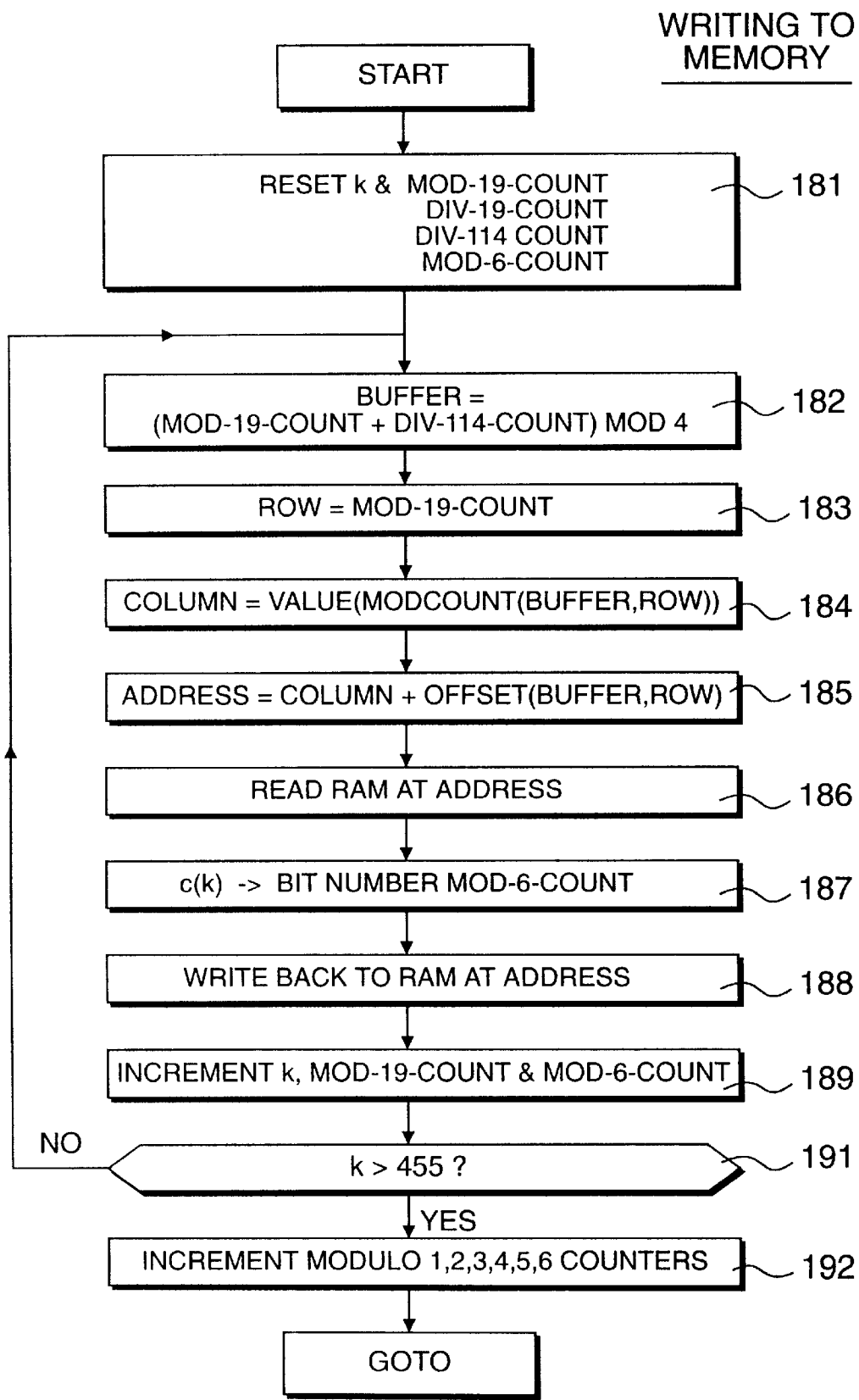
FIG. 18 shows a flowchart for implementing the process shown in FIG. 12 in an electronic circuit.

The procedures shown in FIG. 12, for writing to the buffers shown in FIG. 11, may be re-written in an alternative form, as shown in FIG. 18, where locations in a single dimensional RAM address space are used. Furthermore, mathematical expressions have been replaced by the outputs from the counters 171 to 174, shown in FIG. 17.

A process 181 re-sets all the counters shown in FIG. 17 to zero (the modulo counters used to index columns are not reset at any time). Thus variables "MOD-19-COUNT", "DIV-19-COUNT", "DIV-114-COUNT" and "MOD-6-COUNT" are all set to zero. In the preferred embodiment, all the counters 171 to 174 will automatically reset to a value of zero at this point in the interleaving cycle; process 181 is included to simplify the explanation. A bit counter, k, is also set to zero in process 181.

In a process 182 the buffer index is calculated. The buffer value may take any of the values zero to three, corresponding to the buffers 112 to 115. The buffer value is given by a combination of "MOD-19-COUNT" and "DIV-114-COUNT". In a process 184 the row is given by "MOD-19-COUNT". In a process 185 the column is evaluated in a similar way as shown in FIG. 12, using a look-up table, "MODCOUNT(BUFFER, ROW)", to work out which of the modulo counters is to be used to index the column in the current buffer. In a process 185 an address in random access memory is calculated by adding the column number to the offset value given by the look-up table "OFFSET(BUFFER, ROW)" shown in FIG. 15.

Processes 186, 187 and 188 are used to perform a read-modify-write of the type shown in FIG. 16. In process 186 a six bit word at a location defined by the address evaluated in process 185 is read from random access memory. In process 187 a bit number is given by the expression MOD-6-COUNT, which indicates the position of the bit that is to be modified in the six bit word that has been read from memory. The bit from the current input frame c(k) is then written to the selected one of the six bits in the word that has been read.

In process 188 the six bit word containing the updated bit is written back to the same location in memory from which it was read in process 186. In process 189 the modulo-19 counter 171, the modulo-6 counter 174 and "k" are incremented, resulting in incremented values for MOD-19-COUNT, MOD-6-COUNT and "k", and possible incremented values for DIV-19-COUNT and DIV-114-COUNT. The modulo-19 counter 171 will automatically increment the modulo-6 counter giving the value DIV-19-COUNT and the value DIV-114-COUNT when overflow conditions occur.

At process 191 a comparison is performed to find out whether "k" is greater than 455. If it is not, this indicates that more bits remain in the current input data frame c(0) to c(455) for writing to random access memory. If "k" is greater than 455, this indicates that all the data bits in the current input frame have been written to random access memory. In a process 192 all the modulo counters, modulo-2, modulo-3, modulo-4 and modulo-6 are incremented. Once this has been done the process of writing to random access memory has been completed.

Figure 19:
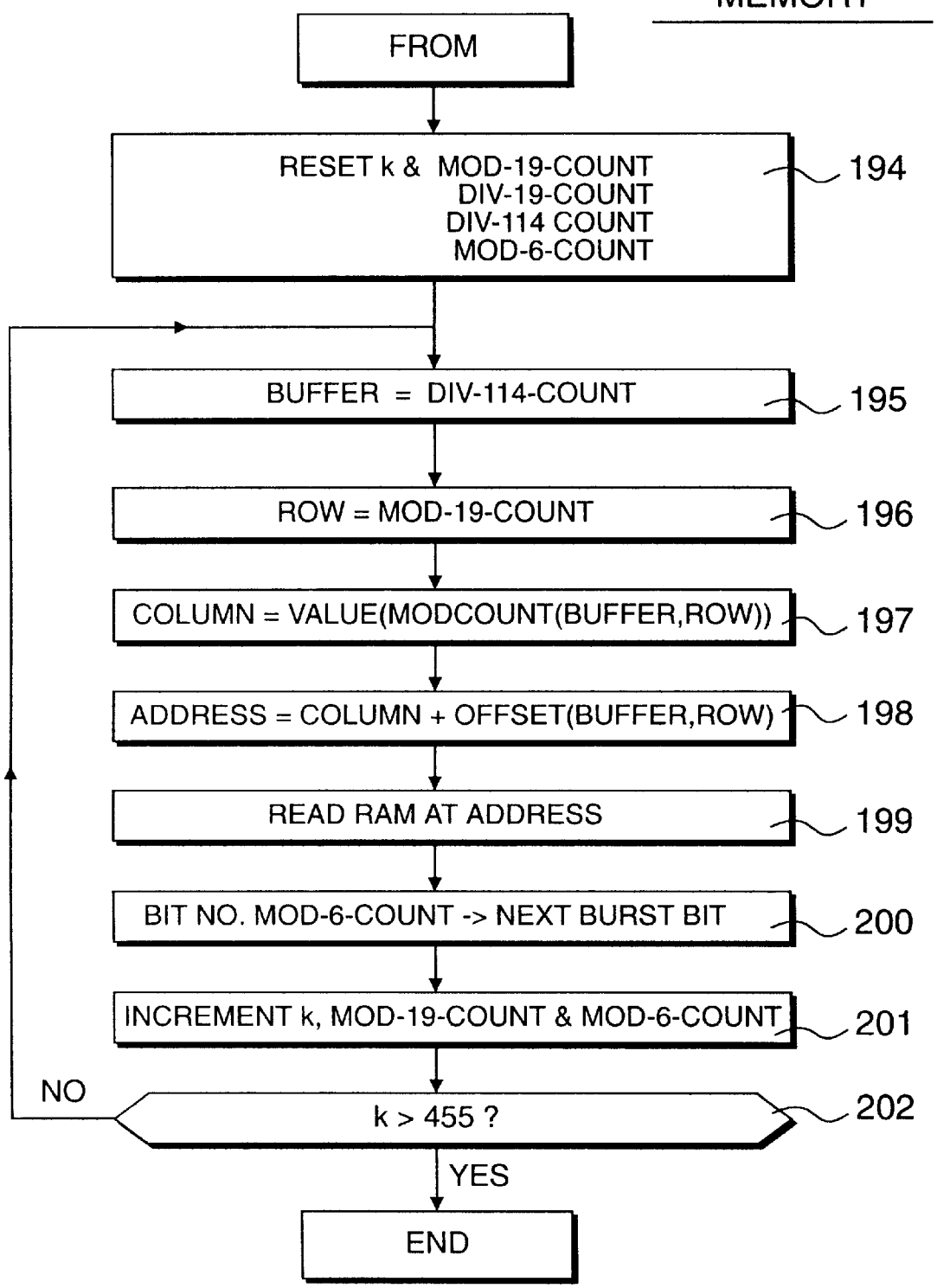
FIG. 19 shows a flowchart for implementing the process shown in FIG. 13 in an electronic circuit.

The procedures shown in FIG. 13 for reading from buffers and creating the next four output bursts may be re-written as shown in FIG. 19. In a process 194 the modulo-19 counters 171 to 174 are reset to zero, again this should happen automatically in the preferred embodiment. Thus, initially, MOD-19-COUNT, DIV-19-COUNT, DIV-114-COUNT and MOD-6-COUNT are all zero values. A bit counter "k" is also set to a value of zero.

In a process 195 the buffer index (0 to 3) is given by the value DIV-114-COUNT.

In process 196 the row is given by MOD-19-COUNT. In process 197 the column is evaluated using look-up tables to determine which of the modulo counters is to be used using a similar procedure of process 185 of FIG. 18. In a process 198 an address in random access memory is calculated by adding the column evaluated in process 197 to an offset value given by the look-up table shown in FIG. 15 which is indexed by the buffer number, and the row.

In process 199 the six bit word at the address in random access memory is read. In a process 200 the position of the bit in the six bit word read in process 199 is given by DIV-19-COUNT, and this bit is then used for the next output bit in the current burst. In a process 201 the modulo-19 counter 171 and the modulo-6 counter 174 are incremented, resulting in incremented values for MOD-19-COUNT and MOD-6-COUNT, and possible incrementations of DIV-19-COUNT and DIV-114-COUNT. In a process 202 a comparison is made to see if k is greater than 455. If it is not, the current series of four output bursts is incomplete and more bits must be read out from random access memory. If "k" is greater than 455, the next four burst have been completed.

Figure 20:
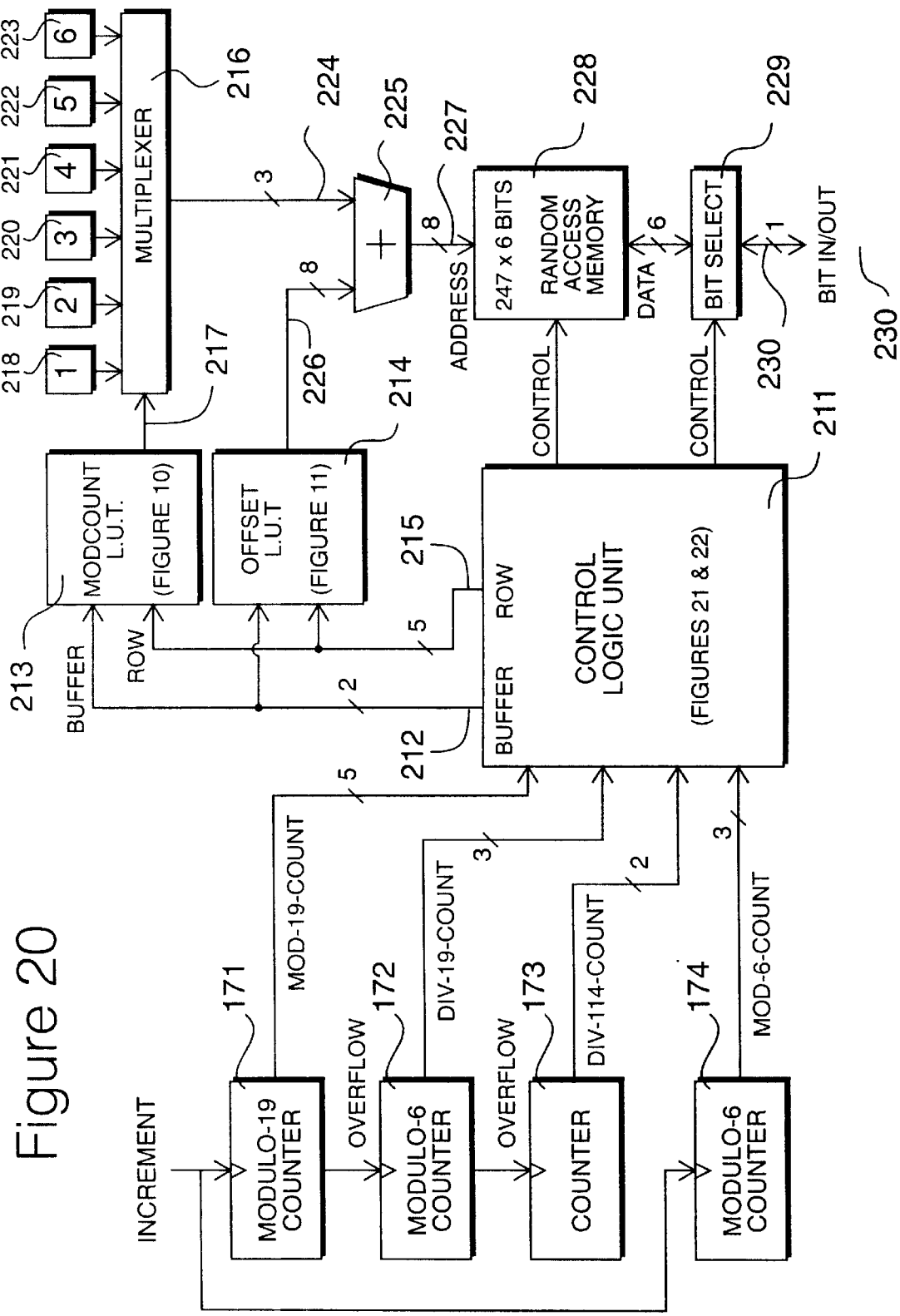
FIG. 20 details the electronic circuit used for the operations defined in FIG. 18 and FIG. 19, including a control logic unit.

A dedicated hardware circuit for implementing the procedures shown in FIGS. 14 and 15 is shown in FIG. 20. The four modulo-counters 171, 172, 173 and 174 supply values to a control logic unit 211 which generates a two bit buffer value 212, defining which of buffers 112 to 115 is selected, corresponding to values zero to three respectively. The two bit buffer value 212 is supplied to the modulo counter look up table "MODCOUNT" 213 and the random access memory offset look up table "OFFSET" 214. The look up tables 213 and 214 also receive a five bit value 215 defining the row of the selected buffer.

The output from the "MODCOUNT" look up table 213 is supplied to a multiplexer 216 such that a three bit control value 217 supplied to the multiplexer 215 is used to define which output from one of the 6 modulo-counters 218 to 223 is supplied to the output of the multiplexer 216.

An output 224 of the multiplexer 206 is supplied to a first input of an adder 225. The second input of the adder 225 is supplied as an output 226 from the random access memory look up table "OFFSET" 214. The output from the adder 225 defines an eight bit value 227 in the range zero to 246 which is used to address a random access memory 228. The control logic unit 211 controls operation of the random access memory 228, such that write or read operations to or from the random access memory 228 may be performed as appropriate.

Each six bit data word addressed in the random access memory 228 is supplied to or from a bit manipulation unit 229. The bit manipulation unit 229 may select and modify bits in a six bit data word according to control data supplied to it by the control logic unit 211. Individual bits 230 may be supplied to or received from the bit input and bit output 230 of the bit manipulation unit 229, according to whether the interpolation circuitry is receiving a bit stream from the error coding process 21 or supplying bits to the encryption process 23.

Operations performed by the control logic unit 211 shown in FIG. 20 for calculating values for variables BUFFER, ROW and BIT values during the interleaving process are detailed in FIG. 21. It can be seen that only a very small amount of arithmetic and multiplexing is required in order to produce the various values required, given the inputs from the modulo counters 171, 172, 173 and 174. The addition between DIV-114-COUNT and MOD-19-COUNT is an addition between two bit and five bit binary values respectively, with the MOD 4 function being achieved by using only the least significant four bits of the sum. All the other operations are achieved by simple routing of input values through multiplexers to output lines.

The circuit shown in FIG. 20 may also be used to perform de-interleaving of data that has been interleaved in the manner that has been described. When de-interleaving data, at each iteration of the de-interleaving process a complete 456 bit data frame has to be generated from a buffer structure identical to the one shown in FIG. 7. Thus a complete data frame has to be generated for every four bursts that are received. A complete data frame will include some data from the current four bursts, but will. mostly consist of data from previous bursts.

When considering the initial interleaving process, it was explained that six bits of the input data frame are transmitted in burst "B", twelve bits to burst "B+1", eighteen bits to burst "B+2", twenty-four bits to burst "B+3" and twenty-four bits to most of the remaining bursts "B+4", "B+5" and so on. Thus when receiving and de-interleaving data the delay requirements are the exact reverse of those for interleaving: an inverted form of the buffer structure shown in FIG. 7 is required with the longest delays at the top and the shortest delays at the bottom. Such a structure may be implemented using the existing hardware by modifying the expression used to define the row number.

In writing and reading memory during interleaving, the expressions shown in FIG. 17 use MOD-19-COUNT to define the row number. If this is changed to "18-MOD-19-COUNT", the required inversion is the result.

Apart from this, the only difference is that MOD-6-COUNT defines the bit position when reading from memory, rather than writing, and that DIV-19-COUNT defines the bit position when writing to memory instead of reading.

In GSM data transmission, bit interleaving and de-interleaving will operate apparently simultaneously, with a very short time delay between the period when one or the other process is being performed. This requires two of the buffer structures shown in FIG. 7 for storing data: one for interleaved data, the other for de-interleaved data. Other elements of the hardware, such as the counters, may be common to both the interleaving and the de-interleaving processes, and single counters may be used to supply the same value to both processes.

In an alternative embodiment it is possible that some or all of the functions described as custom circuitry may be implemented in hardware or software on a semi-custom or off-the-shelf digital signal processor, which may achieve a cost advantage due to the large volume of identical units manufactured.

We claim:

1. A method of de-interleaving interleaved A data, in which data portions from an original data block have been interleaved over a plurality of blocks and interleaved over positions within said interleaved blocks to produce interleaved data, comprising
   partially de-interleaving said interleaved data to its original blocks while writing said data to memory locations, and
   fully de-interleaving said partially de-interleaved data to its original positions within each block while reading said data from memory locations, wherein data is interleaved diagonally within each block.

2. A method according to claim 1, wherein said data is partially de-interleaved by writing said data sequentially to memory locations.

3. A method according to claim 1, wherein partially de-interleaved data is fully de-interleaved while reading said data from memory locations written to during said partial de-interleaving.

4. A method according to claim 1, wherein data is sequentially read from memory locations written to during said partial de-interleaving, said read data is written sequentially to a buffer store, and said buffered partially de-interleaved data is fully de-interleaved while reading said data from said buffer store.

5. A method according to claim 1 wherein data portions comprise individual bits.

6. A method according to claim 1, wherein said data portions comprise a plurality of bits.

7. A method according to claim 6, wherein said plurality of bits each represent a single transmitted bit.

8. A method according to claim 1, wherein said de-interleaved data are of a first type; each block store includes storage capacity for a complete data block; data are written sequentially into their respective data blocks; and unused storage space within a block is arranged to receive a second type of data.

9. A method according to claim 1, wherein said de-interleaving is performed in a communications system, the first type of data is user generated data and the second type of data is control data generated by, and for the use of, the communications system.

10. A method according to claim 9, wherein the communications system is a radio communications system.

11. A method according to claim 10, wherein the radio communications system is a two way cellular radio communications system.

12. A method according to claim 11, wherein the communications system is a GSM cellular radio system and the first type of data is generated by a modem.

13. A method according to claim 12, wherein the second type of data is received from a fast associated control channel.

14. A method according to claim 1, wherein each block comprises 114 bits.

15. A method according to claim 14, wherein four complete blocks of data are de-interleaved to provide a frame of de-interleaved data to a channel de-coder.

16. Apparatus for de-interleaving interleaved data, in which portions of data from an original data block have been distributed over a plurality of blocks and interleaved over positions within each block, comprising
   means for partially de-interleaving the interleaved data into original blocks while writing said data to storage means, and
   means for de-interleaving said partially de-interleaved data into original positions within each block while reading said data from storage means, wherein data is interleaved diagonally within each block.

17. Apparatus according to claim 16, wherein said means for partially de-interleaving the interleaved data includes means for sequentially writing said data to memory locations.

18. Apparatus according to claim 16, wherein said means for de-interleaving said partially de-interleaved data includes means for reading said data from said storage means written to by said means for partially de-interleaving said data.

19. Apparatus according to claim 16, including a buffer store and means for sequentially reading data written by said means for partially de-interleaving said data to said buffer store, wherein said means for de-interleaving said partially de-interleaved data includes means for reading data from said buffer store.

20. Apparatus according to claim 16, wherein data portions comprise individual bits.

21. Apparatus according to claim 16, wherein data portions comprise a plurality of bits.

22. Apparatus according to claim 21, wherein said plurality of bits each represent a single transmitted bit.

23. Apparatus according to claim 16, wherein said de-interleaved data are of a first type; each block store includes storage capacity for a complete data block; data are written sequentially into their respective data blocks; and unused storage space within a block is arranged to receive a second type of data.

24. Apparatus according to claim 23, wherein said de-interleaving is performed in a communications system, the first type of data is user generated data and the second type of data is control data generated by, and for the use of, the communications system.

25. Apparatus according to claim 24, wherein a communications system is a radio communications system.

26. Apparatus according to claim 25, wherein the radio communications system is a two way cellular radio communications system.

27. Apparatus according to claim 26, wherein the communications system is a GSM cellular radio system.

28. Apparatus according to claim 27, wherein the second type of data is received from a fast associated control channel.

29. Apparatus according to claim 16, wherein each block comprises 114 bits.

30. Apparatus according to claim 29, wherein four complete blocks of data are de-interleaved to provide a frame of de-interleaved data to a channel de-coding device.

* * * * *